(12) United States Patent
Wu et al.

(10) Patent No.: US 11,011,574 B2
(45) Date of Patent: May 18, 2021

(54) TOP EMISSION MICROLED DISPLAY AND BOTTOM EMISSION MICROLED DISPLAY AND A METHOD OF FORMING THE SAME

(71) Applicant: Prilit Optronics, Inc., Tainan (TW)

(72) Inventors: Biing-Seng Wu, Tainan (TW); Chao-Wen Wu, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 0 days.

(21) Appl. No.: 16/730,723

(22) Filed: Dec. 30, 2019

(65) Prior Publication Data

US 2020/0135801 A1   Apr. 30, 2020

Related U.S. Application Data

(62) Division of application No. 16/128,255, filed on Sep. 11, 2018, now abandoned.

(51) Int. Cl.
| | |
|---|---|
| *H01L 27/15* | (2006.01) |
| *H01L 33/62* | (2010.01) |
| *H01L 33/36* | (2010.01) |
| *H01L 33/58* | (2010.01) |
| *G03F 7/00* | (2006.01) |
| *G09G 3/32* | (2016.01) |
| *G09G 3/20* | (2006.01) |

(52) U.S. Cl.
CPC .......... *H01L 27/156* (2013.01); *G03F 7/0007* (2013.01); *H01L 33/36* (2013.01); *H01L 33/58* (2013.01); *H01L 33/62* (2013.01); *G09G 3/2003* (2013.01); *G09G 3/32* (2013.01)

(58) Field of Classification Search
CPC ....... H01L 27/156; H01L 33/58; H01L 33/62; H01L 25/0753; H01L 33/48–486; H01L 2933/0033; H01L 25/167; H01L 33/36–42; H01L 2933/0016; H01L 2933/0066; G03F 7/0007; G09G 3/32; G09G 3/2003
See application file for complete search history.

(56) References Cited

U.S. PATENT DOCUMENTS

| | | |
|---|---|---|
| 2008/0194054 A1 | 8/2008 | Lin |
| 2010/0188794 A1 | 7/2010 | Park |
| 2010/0248484 A1 | 9/2010 | Bower |
| 2012/0168776 A1 | 7/2012 | Nakamura |
| 2012/0250320 A1 | 10/2012 | Harbers |
| 2013/0126081 A1 | 5/2013 | Hu |
| 2013/0194795 A1 | 8/2013 | Onaka et al. |
| 2014/0084482 A1 | 3/2014 | Hu |
| 2014/0159043 A1 | 6/2014 | Sakariya |
| 2014/0159064 A1 | 6/2014 | Sakariya |
| 2014/0346537 A1 | 11/2014 | Xi |
| 2017/0062674 A1* | 3/2017 | Kwon ................. H01L 25/0753 |
| 2017/0294456 A1* | 10/2017 | Lee ................... H01L 21/02595 |
| 2018/0182746 A1 | 6/2018 | Bibl et al. |

(Continued)

*Primary Examiner* — Cuong B Nguyen
(74) *Attorney, Agent, or Firm* — Donald E. Stout; Stout, Uxa & Buyan, LLP

(57) ABSTRACT

A microLED display includes a first main substrate, microLEDs disposed above the first main substrate, a first light blocking layer disposed above the first main substrate to define emission areas, a light guiding layer disposed in the emission areas, and a plurality of connecting structures disposed in the emission areas respectively and electrically connected with the microLEDs.

19 Claims, 31 Drawing Sheets

(56) References Cited

U.S. PATENT DOCUMENTS

2019/0006329 A1* 1/2019 Hashim ................ H01L 33/486
2019/0214376 A1* 7/2019 Kim ...................... H01L 25/167
2019/0235320 A1   8/2019 Lin et al.

* cited by examiner

TOP EMISSION MICROLED DISPLAY AND BOTTOM EMISSION MICROLED DISPLAY AND A METHOD OF FORMING THE SAME

CROSS-REFERENCE TO RELATED APPLICATIONS

This application is a divisional application of U.S. application Ser. No. 16/128,255, filed on Sep. 11, 2018, the entire contents of which are herein expressly incorporated by reference.

BACKGROUND OF THE INVENTION

1. Field of the Invention

The present invention generally relates to a light-emitting diode (LED) display, and more particularly to a top emission microLED display and a bottom emission microLED display.

2. Description of Related Art

A micro light-emitting diode (microLED, mLED or μLED) display panel is one type of flat display panel, which is composed of microscopic microLEDs each having a size of 1-10 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

Active matrix using thin-film transistors (TFT) may be used in companion with microLEDs to drive a display panel. However, microLED is made by flip chip technology, while TFT is made by complementary metal-oxide-semiconductor (CMOS) process which is more complex than flip chip technology. These two distinct technologies may cause thermal mismatch. A drive current of the microLED is small in gray display, which may be significantly affected by leakage current.

Passive matrix is another driving method performed by a row drive circuit and a column drive circuit, which are disposed on the periphery of a display panel. When the size or the resolution of the display panel increases, output loading and delay of the drive circuits increase accordingly, causing the display panel to malfunction. Therefore, passive matrix is not suitable for large-size microLED display panels.

A need has thus arisen to propose a novel microLED display panel, particularly a large-size or high-resolution display panel, which is capable of maintaining advantages of microLEDs and overcoming disadvantages of driving schemes.

As adjacent microLEDs are near to each other, interference (e.g., color mixing) between adjacent microLEDs may happen and thus decrease contrast ratio. Moreover, non-uniform display may happen due to connecting wires composed of opaque or reflective material that connecting the microLEDs with other components or circuits.

A need has thus arisen to propose a novel microLED display with luminous efficacy improvement over the conventional microLED displays.

SUMMARY OF THE INVENTION

In view of the foregoing, it is an object of the embodiment of the present invention to provide structures and forming methods of a top emission microLED display and a bottom emission microLED display capable of prevent interference, color mixing and non-uniform display issues.

According to one embodiment, a top emission microLED display includes a first main substrate; a bottom common electrode layer disposed on a top surface of the first main substrate; a plurality of microLEDs disposed on the bottom common electrode layer; a first light blocking layer disposed on the bottom common electrode layer to define a plurality of emission areas; a light guiding layer disposed in the emission areas; and a plurality of connecting structures disposed in the emission areas respectively and electrically connected with the microLEDs.

According to another embodiment, a bottom emission microLED display includes a first main substrate; a plurality of microLEDs disposed above the first main substrate; a first light blocking layer disposed above the first main substrate to define a plurality of emission areas; a light guiding layer disposed in the emission areas; a plurality of connecting structures disposed in the emission areas respectively and electrically connected with the microLEDs; and a top common electrode layer disposed above the first light blocking layer and the microLEDs.

DETAILED DESCRIPTION OF THE INVENTION

Figure 1:
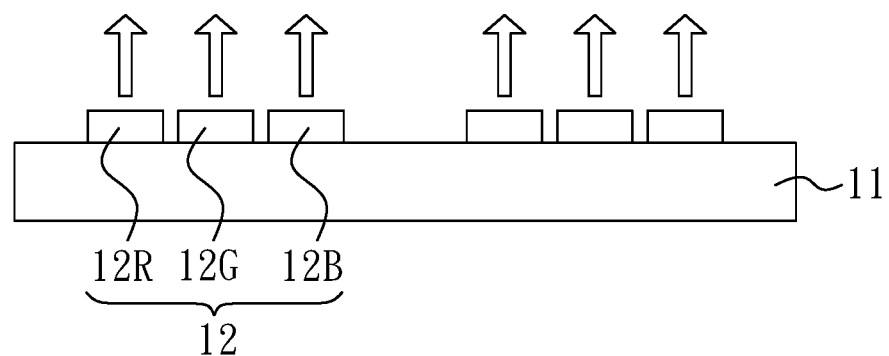
FIG. 1 schematically shows a side view of a top emission microLED display.

FIG. 1 schematically shows a side view of a top emission micro light-emitting diode (microLED) display 100. In the embodiment, microLEDs 12 (e.g., red microLED 12R, green microLED 12G and blue microLED 12B) may be disposed on a top surface of a main substrate 11 by a bonding technique. As the microLEDs 12 emit light upward (as shown by arrows) against the top surface of the main substrate 11, the display 100 is called a top emission microLED display. In the specification, the microLEDs 12 have a size of 1-10 micrometers, which may be decreased or increased according to specific applications or technological development in the future.

Figure 2A:
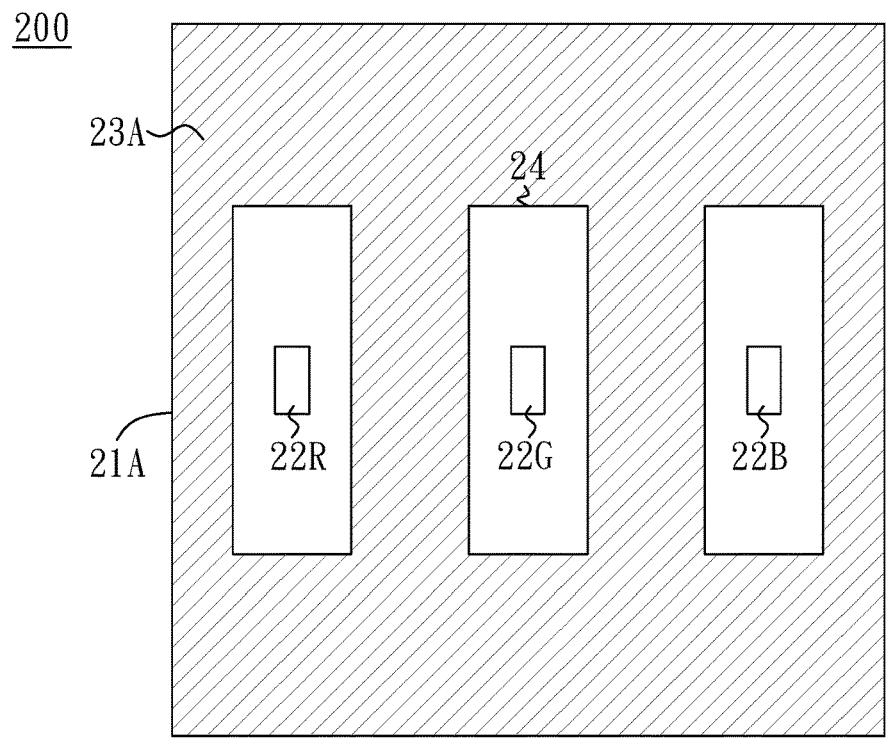
FIG. 2A shows a top view of a top emission microLED display according to a first embodiment of the present invention.
Figure 2B:
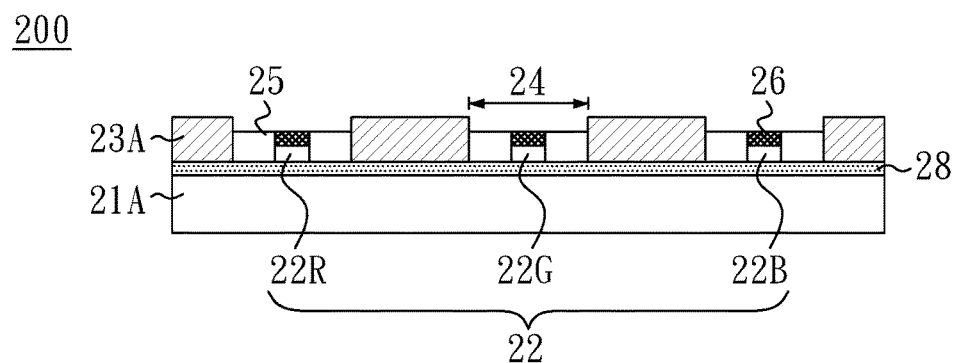
FIG. 2B shows a cross-sectional view of FIG. 2A.

FIG. 2A shows a top view of a top emission microLED display 200 according to a first embodiment of the present invention, and FIG. 2B shows a cross-sectional view of FIG. 2A. In the embodiment, microLEDs 22 (e.g., red microLED 22R, green microLED 22G and blue microLED 22B) may be disposed above a (first) main substrate 21A. A (first) light blocking layer 23A is disposed between adjacent microLEDs 22 and above the (first) main substrate 21A to prevent interference (e.g., color mixing) between adjacent microLEDs 22 and to enhance contrast. A bottom common electrode layer 28 may be disposed between the main substrate 21A and the microLEDs 22. In the present embodiment (and the following embodiments), the microLED 22 may be a rectangle, for example, with a length of 25 micrometers and a width of 10 micrometers. According to one aspect of the embodiment, the microLEDs 22 may be disposed longitudinally. That is, the length of the microLED 22 is parallel to the longitude of the display 200, and the width of the microLED is parallel to the latitude of the display 200. As human eyes are more sensitive to vertically emitted light than horizontally emitted light, the display 200 of the embodiment can enhance viewing angle.

The (first) light blocking layer 23A of the embodiment may include black matrix (BM). In the embodiment shown in FIG. 2B, black resin is first formed, followed by adopting photo process and curing process to form the BM (first) light blocking layer 23A. In another embodiment, ink-jet printing technique and curing process are adopted to form the BM (first) light blocking layer 23A.

The (first) light blocking layer 23A defines emission areas 24, which are not covered with the (first) light blocking layer 23A. In other words, areas other than the emission areas 24 are covered with the (first) light blocking layer 23A. A light guiding layer 25, composed of light guiding material, is disposed in the emission areas 24 to spread the light emitted by the microLEDs 22. The light guiding material is transparent with high refractive index. In the embodiment, the light guiding layer 25 is entirely formed in the emission areas 24.

In the embodiment, the (first) light blocking layer 23A has a thickness greater than the light guiding layer 25. Further, the light guiding layer 25 has a thickness greater than or equal to the microLEDs 22.

Figure 2C:
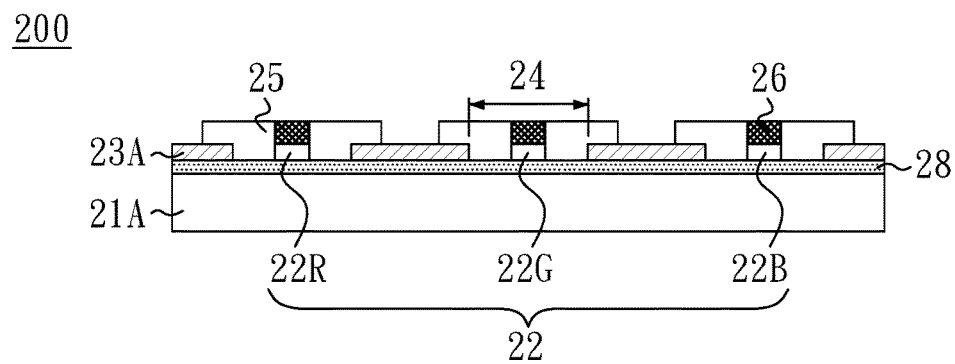
FIG. 2C shows a cross-sectional view of a top emission microLED display according to a modified first embodiment of the present invention.

FIG. 2C shows a cross-sectional view of a top emission microLED display 200 according to a modified first embodiment of the present invention. In the embodiment shown in FIG. 2C, the (first) light blocking layer 23A has a thickness less than the light guiding layer 25. Moreover, the (first) light blocking layer 23A and the light guiding layer 25 partially overlap each other, and the (first) light blocking layer 23A is partially covered with the light guiding layer 25. In the embodiment shown in FIG. 2C, a chromium/chromium oxide film is first formed, followed by adopting photo etching technique to form the BM (first) light blocking layer 23A.

Figure 2D:
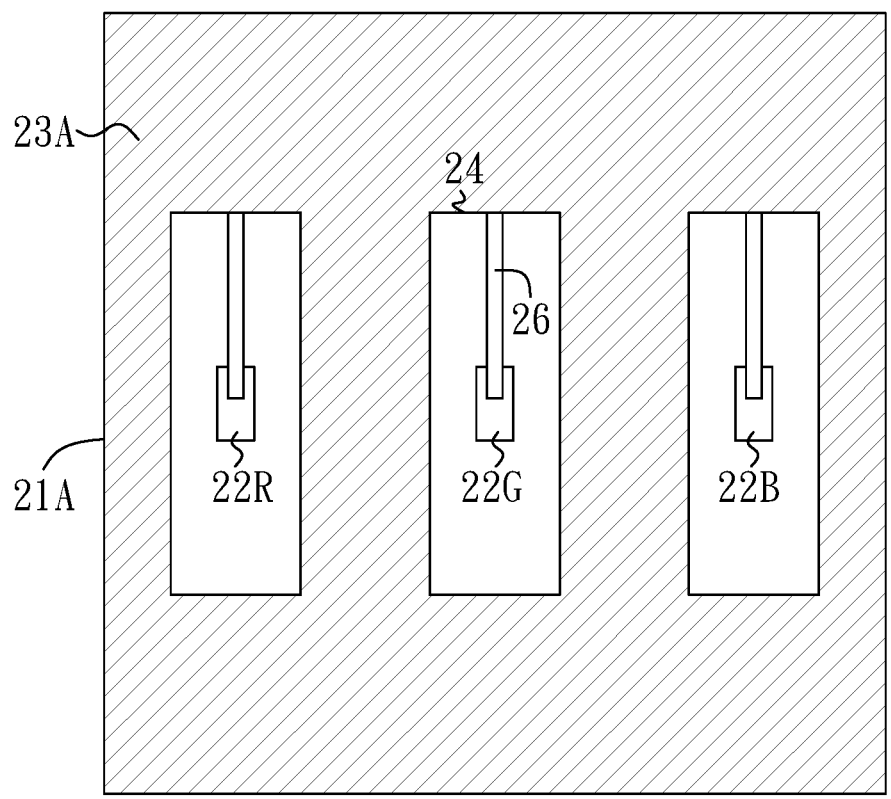
FIG. 2D shows another top view of the top emission microLED display according to the first embodiment of the present invention.

FIG. 2D shows another top view of the top emission microLED display 200 according to the first embodiment of the present invention. A connecting structure 26, such as conductive electrode, is disposed on a top surface of the microLED 22 in each emission area 24. The connecting structure 26 may include transparent material (e.g., indium tin oxide), opaque material (e.g., metal) or reflective material. According to one aspect of the embodiment, the connecting structures 26 in the emission areas 24 have the same pattern, which can prevent nonuniform display issue.

Figure 3A:
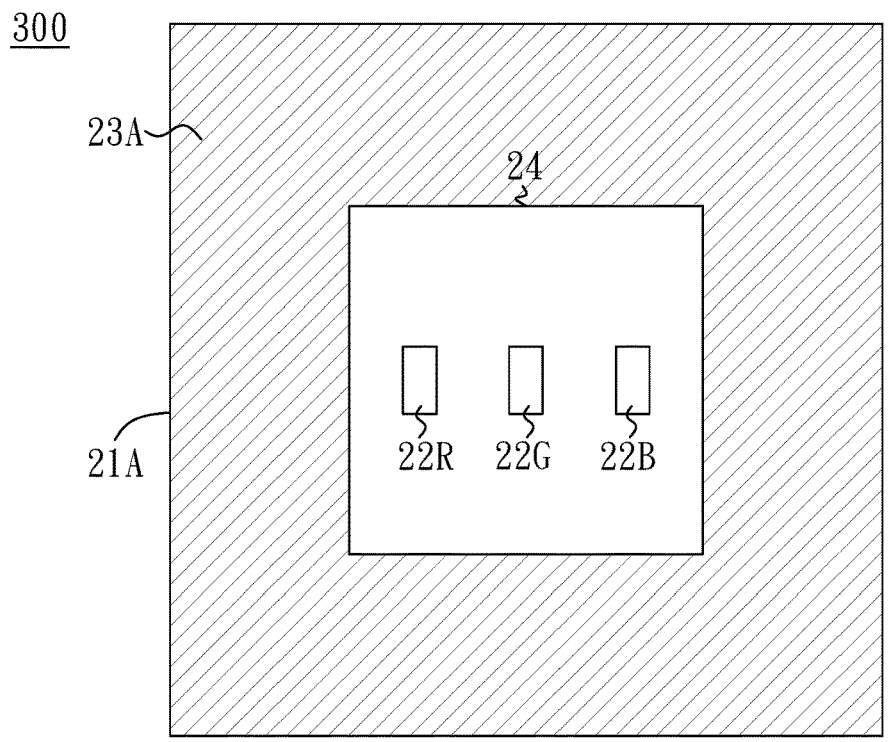
FIG. 3A shows a top view of a top emission microLED display according to a second embodiment of the present invention.
Figure 3B:
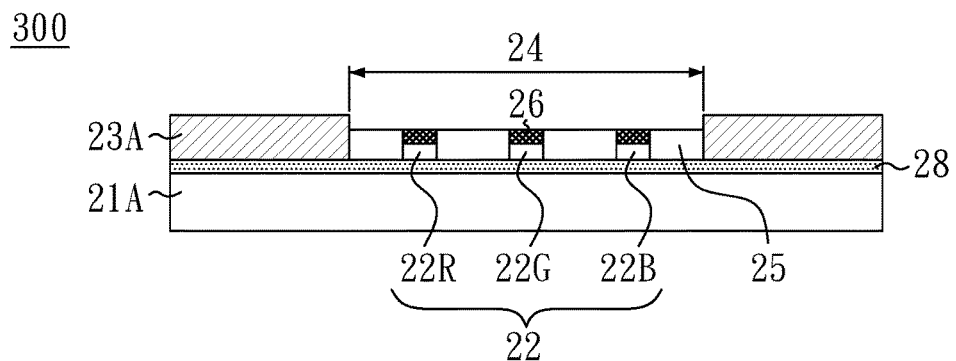
FIG. 3B shows a cross-sectional view of FIG. 3A.

FIG. 3A shows a top view of a top emission microLED display 300 according to a second embodiment of the present invention, and FIG. 3B shows a cross-sectional view of FIG. 3A. The second embodiment is similar to the first embodiment with the exception that, in the second embodiment, the (first) light blocking layer 23A is disposed between adjacent pixels (instead of adjacent microLEDs 22) to prevent interference (e.g., color mixing) between adjacent pixels and to enhance contrast.

The (first) light blocking layer 23A defines emission areas 24, which are not covered with the (first) light blocking layer 23A. In other words, areas other than the emission areas 24 are covered with the (first) light blocking layer 23A. In the embodiment, the light guiding layer 25 is entirely formed in the emission areas 24.

In the embodiment, the (first) light blocking layer 23A has a thickness greater than the light guiding layer 25. Further, the light guiding layer 25 has a thickness greater than the microLEDs 22 as shown in FIG. 3B. In another embodiment, however, the light guiding layer 25 has a thickness less than or equal to the microLEDs 22.

Figure 3C:
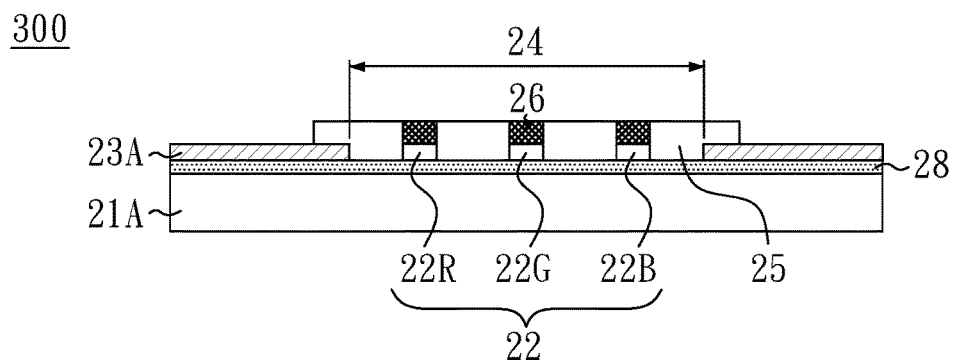
FIG. 3C shows a cross-sectional view of a top emission microLED display according to a modified second embodiment of the present invention.

FIG. 3C shows a cross-sectional view of a top emission microLED display 300 according to a modified second embodiment of the present invention. In the embodiment shown in FIG. 3C, the (first) light blocking layer 23A has a thickness less than the light guiding layer 25. Moreover, the (first) light blocking layer 23A and the light guiding layer 25 partially overlap each other, and the (first) light blocking layer 23A is partially covered with the light guiding layer 25.

Figure 3D:
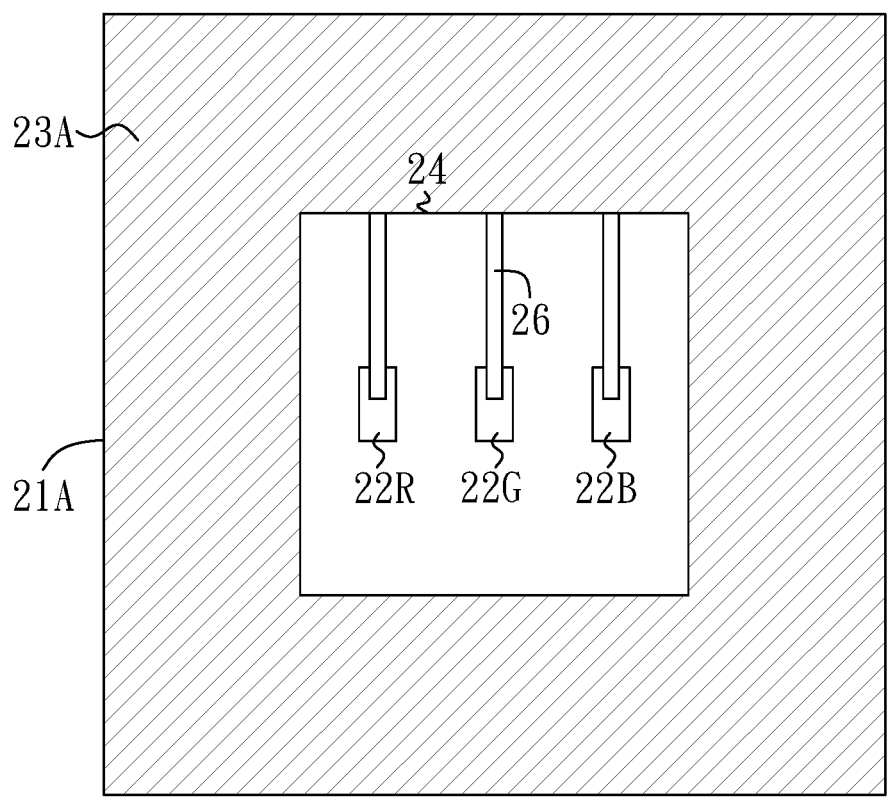
FIG. 3D shows another top view of the top emission microLED display according to the second embodiment of the present invention.

FIG. 3D shows another top view of the top emission microLED display 300 according to the second embodiment of the present invention. A connecting structure 26, such as conductive electrode, is disposed on a top surface of the microLED 22 in each emission area 24. According to one aspect of the embodiment, the connecting structures 26 in the emission areas 24 have the same pattern and the connecting structures 26 in each emission area 24 have the same pattern, which can prevent nonuniform display issue.

Figure 4A:
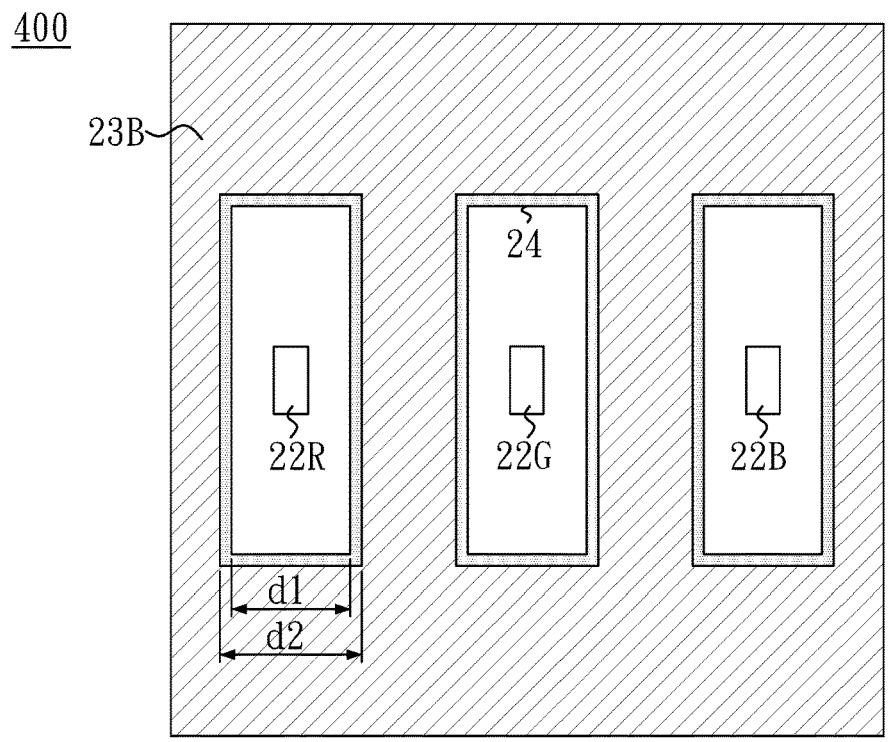
FIG. 4A shows a top view of a top emission microLED display according to a third embodiment of the present invention.
Figure 4B:
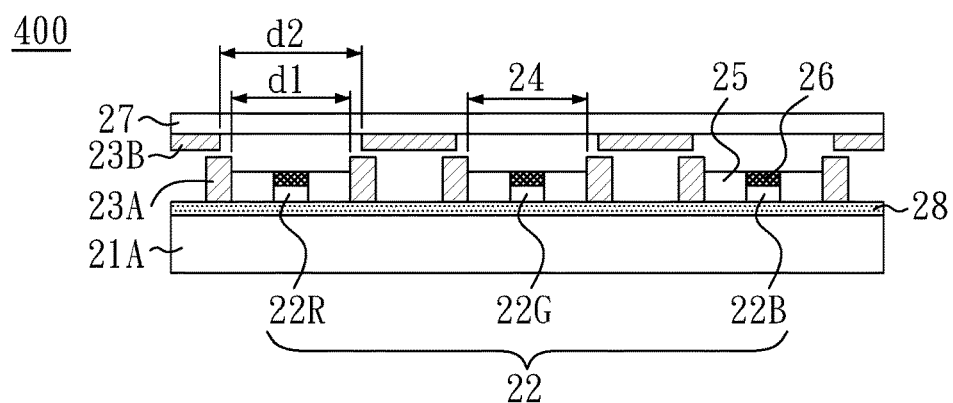
FIG. 4B shows a cross-sectional view of FIG. 4A.

FIG. 4A shows a top view of a top emission microLED display 400 according to a third embodiment of the present invention, and FIG. 4B shows a cross-sectional view of FIG. 4A. In the embodiment, microLEDs 22 (e.g., red microLED 22R, green microLED 22G and blue microLED 22B) may be disposed above a (first) main substrate 21A. Each microLED 22 corresponds to an emission area 24. In the embodiment, a frame-shaped first light blocking layer 23A surrounds the emission area 24 and is disposed above the (first) main substrate 21A. In the embodiment, a blocking substrate 27 is disposed above the (first) main substrate 21A and the first light blocking layer 23A. A second light blocking layer 23B, which covers areas other than the emission areas 24 and the first light blocking layer 23A, is disposed on a bottom surface of the blocking substrate 27. The first light blocking layer 23A and the second light blocking layer 23B partially overlap each other. Accordingly, an aperture d1 of the first light blocking layer 23A is different from (e.g., smaller than) an aperture d2 of the second light blocking layer 23B. In another embodiment, the aperture of the first light blocking layer 23A is greater than the aperture of the second light blocking layer 23B. In the embodiment, the first light blocking layer 23A and the second light blocking layer 23B may include BM, and the blocking substrate 27 may include transparent material such as quartz, glass or plastic material.

A light guiding layer 25, composed of light guiding material, is disposed in the emission areas 24 to spread the light emitted by the microLEDs 22. In the embodiment, the light guiding layer 25 is entirely formed in the emission areas 24.

In the embodiment, the first light blocking layer 23A has a thickness greater than the light guiding layer 25. Further, the light guiding layer 25 has a thickness greater than the microLEDs 22 as shown in FIG. 4B. In another embodiment, however, the light guiding layer 25 has a thickness less than or equal to the microLEDs 22.

Figure 4C:
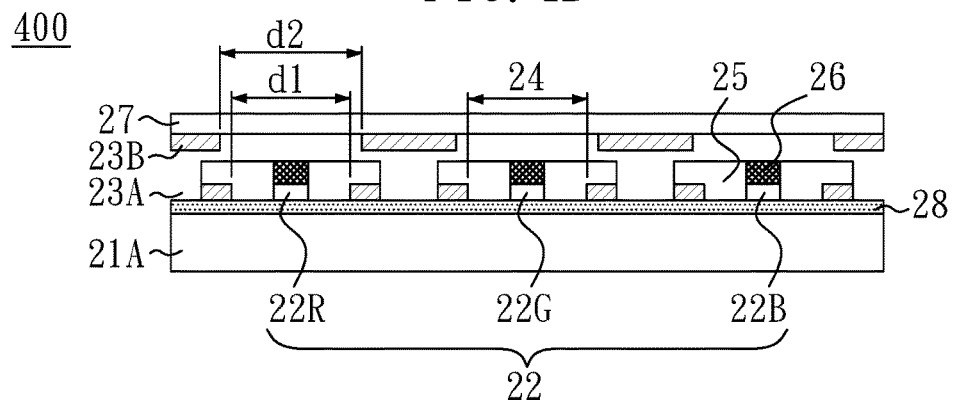
FIG. 4C shows a cross-sectional view of a top emission microLED display according to a modified third embodiment of the present invention.

FIG. 4C shows a cross-sectional view of a top emission microLED display 400 according to a modified third embodiment of the present invention. In the embodiment shown in FIG. 4C, the first light blocking layer 23A has a thickness less than the light guiding layer 25. Moreover, the first light blocking layer 23A is partially covered with the light guiding layer 25.

According to one aspect of the embodiment, the connecting structures 26 (not shown) in each emission area 24 have the same pattern, which can prevent nonuniform display issue.

Figure 5A:
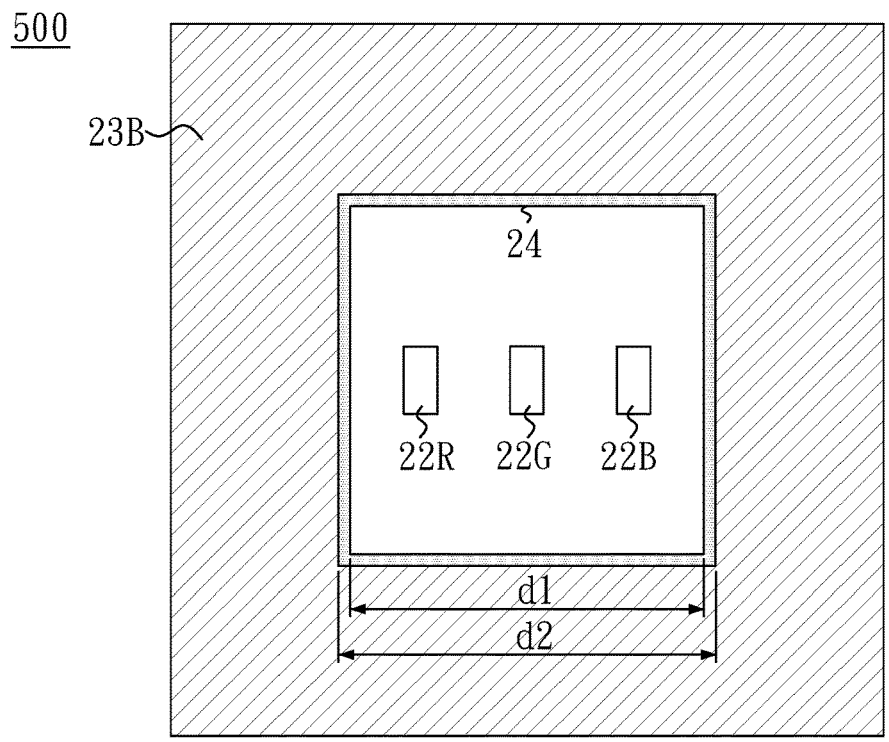
FIG. 5A shows a top view of a top emission microLED display according to a fourth embodiment of the present invention.
Figure 5B:
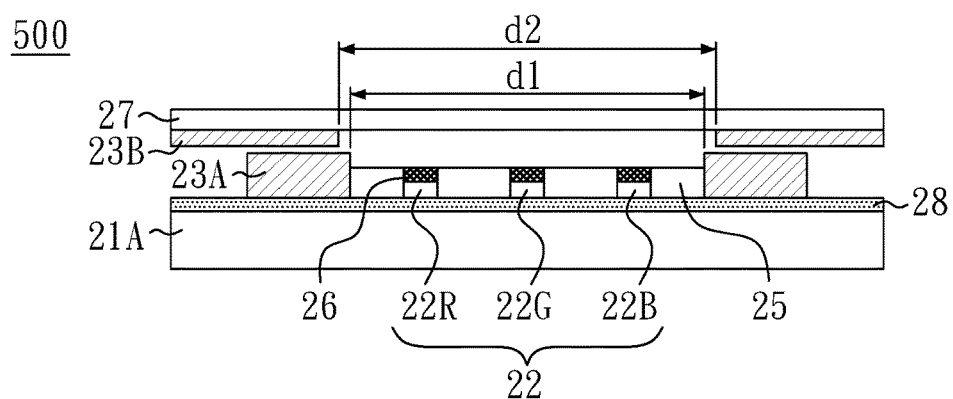
FIG. 5B shows a cross-sectional view of FIG. 5A.

FIG. 5A shows a top view of a top emission microLED display 500 according to a fourth embodiment of the present invention, and FIG. 5B shows a cross-sectional view of FIG. 5A. The fourth embodiment is similar to the third embodiment with the exception that, in the fourth embodiment, the first light blocking layer 23A and the second light blocking layer 23B are disposed between adjacent pixels (instead of adjacent microLEDs 22) to prevent interference (e.g., color mixing) between adjacent pixels and to enhance contrast.

In the embodiment, each pixel (which includes red microLED 22R, green microLED 22G and blue microLED 22B) corresponds to an emission area 24. In the embodiment, a frame-shaped first light blocking layer 23A surrounds the emission area 24 and is disposed above the (first) main substrate 21A. In the embodiment, a second light blocking layer 23B, which covers areas other than the emission areas 24 and the first light blocking layer 23A, is disposed on a bottom surface of the blocking substrate 27. The first light blocking layer 23A and the second light blocking layer 23B partially overlap each other. Accordingly, an aperture d1 of the first light blocking layer 23A is different from (e.g., smaller than) an aperture d2 of the second light blocking layer 23B. In the embodiment, the first light blocking layer 23A and the second light blocking layer 23B may include BM, and the blocking substrate 27 may include transparent material such as quartz, glass or plastic material.

A light guiding layer 25, composed of light guiding material, is disposed in the emission areas 24 to spread the light emitted by the microLEDs 22. In the embodiment, the light guiding layer 25 is entirely formed in the emission areas 24.

In the embodiment, the first light blocking layer 23A has a thickness greater than the light guiding layer 25. Further, the light guiding layer 25 has a thickness greater than the microLEDs 22 as shown in FIG. 5B. In another embodiment, however, the light guiding layer 25 has a thickness less than or equal to the microLEDs 22.

Figure 5C:
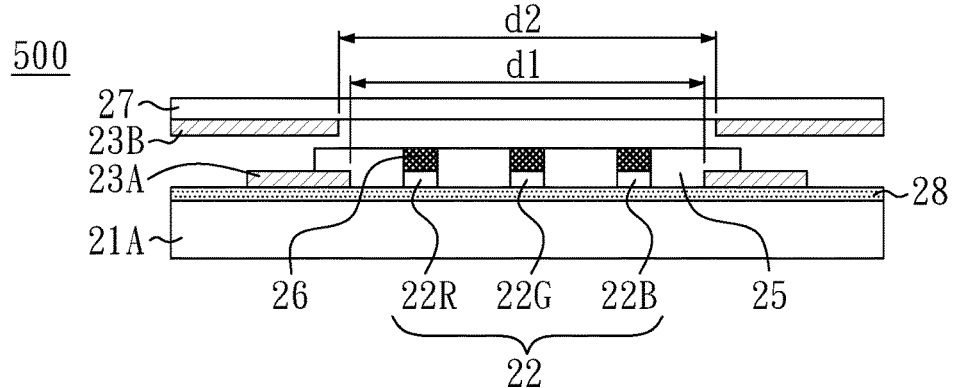
FIG. 5C shows a cross-sectional view of a top emission microLED display according to a modified fourth embodiment of the present invention.

FIG. 5C shows a cross-sectional view of a top emission microLED display 500 according to a modified fourth embodiment of the present invention. In the embodiment shown in FIG. 5C, the first light blocking layer 23A has a thickness less than the light guiding layer 25. Moreover, the first light blocking layer 23A is partially covered with the light guiding layer 25.

According to one aspect of the embodiment, the connecting structures 26 (not shown) in the emission areas 24 have the same pattern and the connecting structures 26 in each emission area 24 have the same pattern, which can prevent nonuniform display issue.

Figure 6:
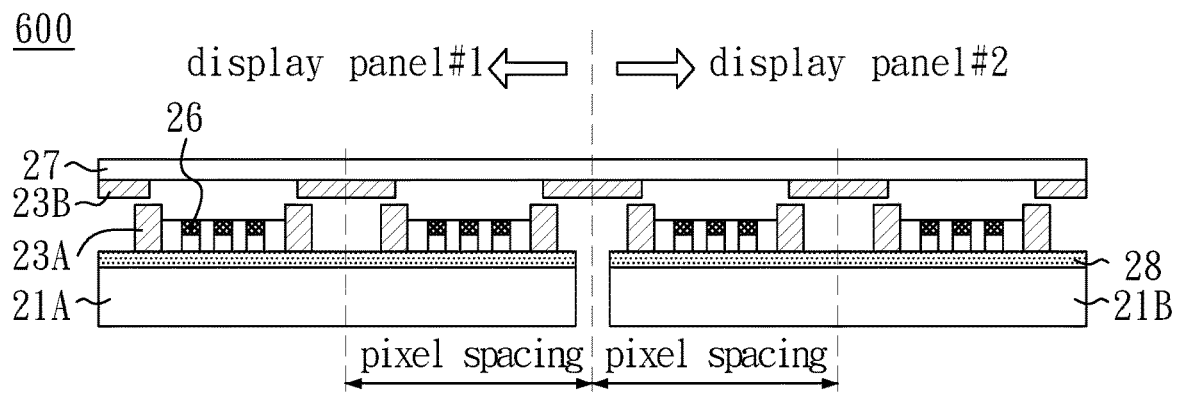
FIG. 6 shows a cross-sectional view of a top emission microLED display according to a fifth embodiment of the present invention.

FIG. 6 shows a cross-sectional view of a top emission microLED display 600 according to a fifth embodiment of the present invention. In the embodiment, the top emission microLED display 600 may include a first main substrate 21A and a second main substrate 21B, which are disposed at a same level but correspond to distinct microLED displays, respectively. A first light blocking layer 23A is disposed above the first main substrate 21A and the second main substrate 21B. Similar to the fourth embodiment, the top emission microLED display 600 may include a second light blocking layer 23B, which covers areas other than the emission areas 24 and the first light blocking layer 23A, being disposed on a bottom surface of the blocking substrate 27. As shown in FIG. 6, the first main substrate 21A and the second main substrate 21B correspond to the same blocking substrate 27, and the first light blocking layer 23A of the first main substrate 21A and the second light blocking layer 23B of the second main substrate 21B correspond to the same second light blocking layer 23B at a joint of the first main substrate 21A and the second main substrate 21B. Accordingly, multiple microLED displays may be joined to become a seamless top emission microLED display 600.

Figure 7A:
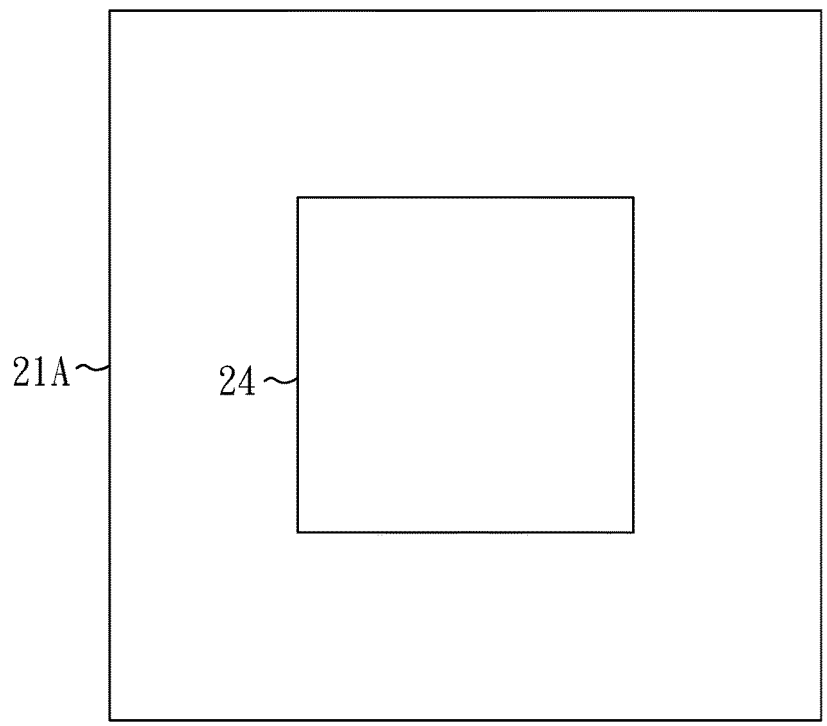
FIG. 7A to FIG. 13B show top views and cross-sectional views illustrating steps of forming a top emission microLED display according to one embodiment of the present invention.
Figure 7B:
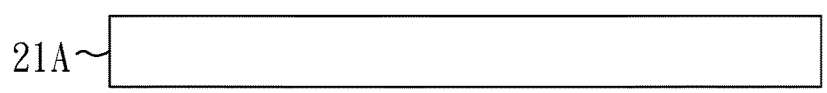
Figure 8A:
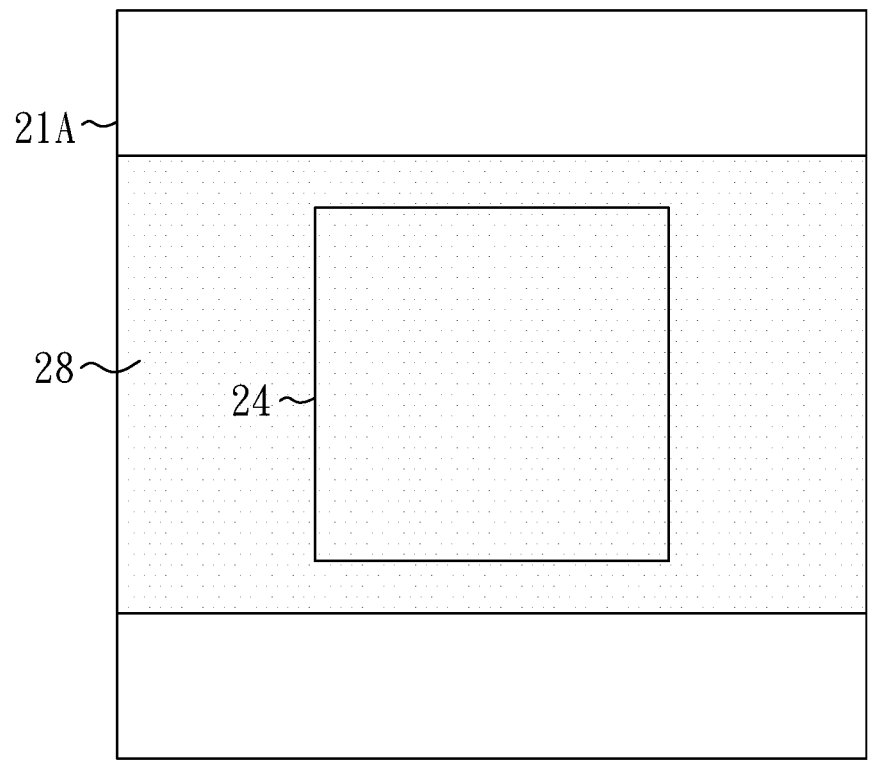
Figure 8B:

FIG. 7A to FIG. 13B show top views and cross-sectional views illustrating steps of forming a top emission microLED display according to one embodiment of the present invention. As shown in FIG. 7A and FIG. 7B, a (first) main substrate 21A, which defines an emission area 24, is provided. As shown in FIG. 8A and FIG. 8B, a bottom common electrode layer 28 is formed on a top surface of the (first) main substrate 21A. According to one aspect of the embodiment, the bottom common electrode layer 28 entirely covers the emission area 24 to prevent nonuniform display issue.

Figure 9A:
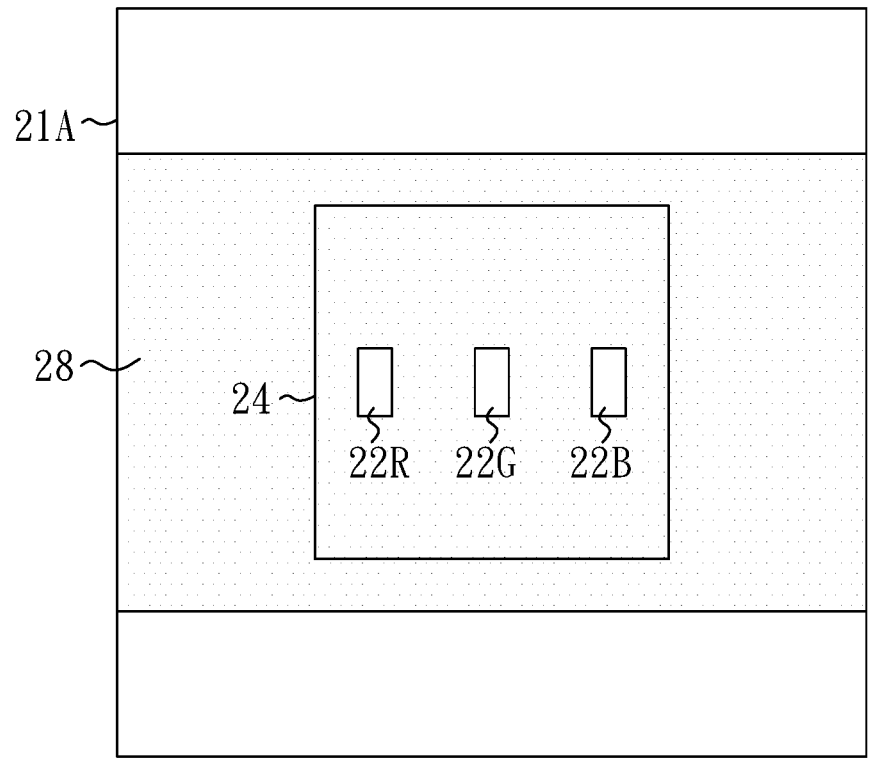
Figure 9B:
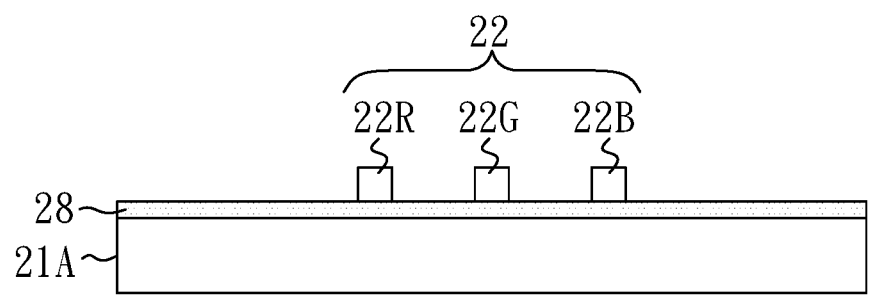
Figure 10A:
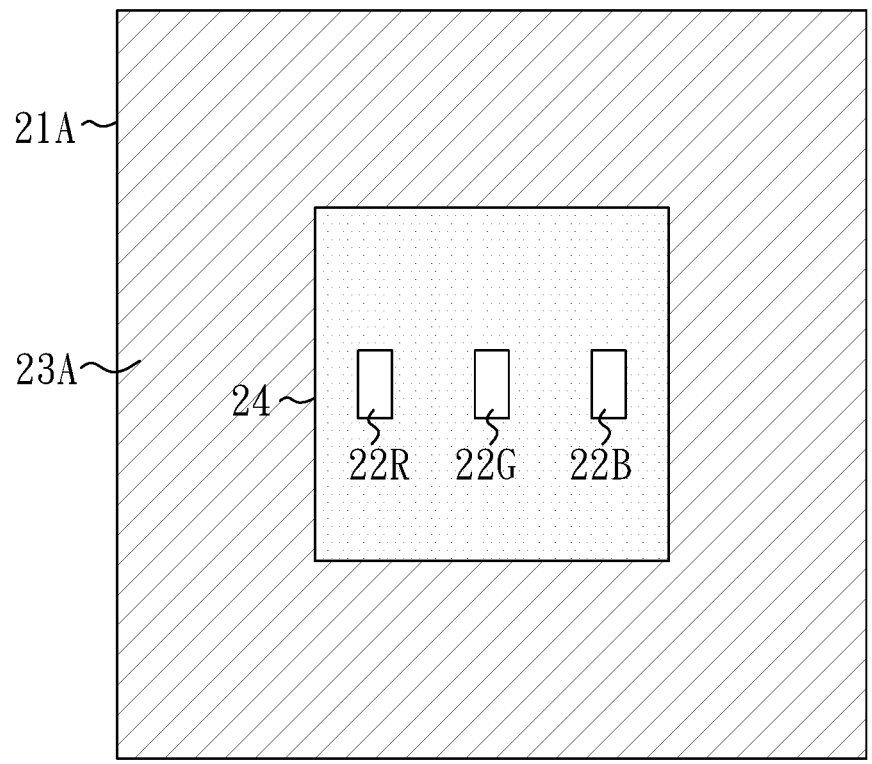
Figure 10B:
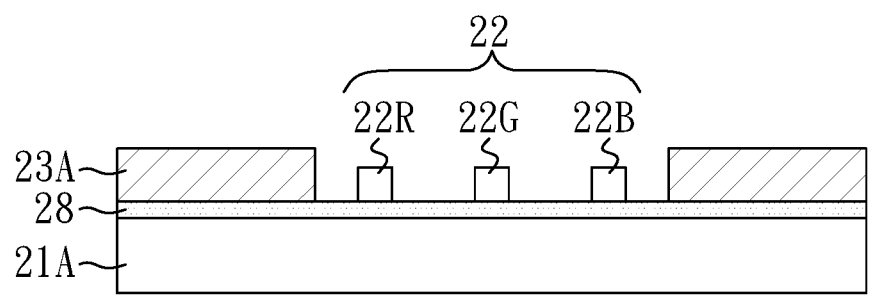

As shown in FIG. 9A and FIG. 9B, microLEDs 12 (e.g., red microLED 12R, green microLED 12G and blue microLED 12B) are disposed on a top surface of the bottom common electrode layer 28 by a bonding technique. As shown in FIG. 10A and FIG. 10B, a (first) light blocking layer 23A is disposed in an area other than the emission area 24 to prevent interference (e.g., color mixing) between adjacent pixels and to enhance contrast.

Figure 11A:
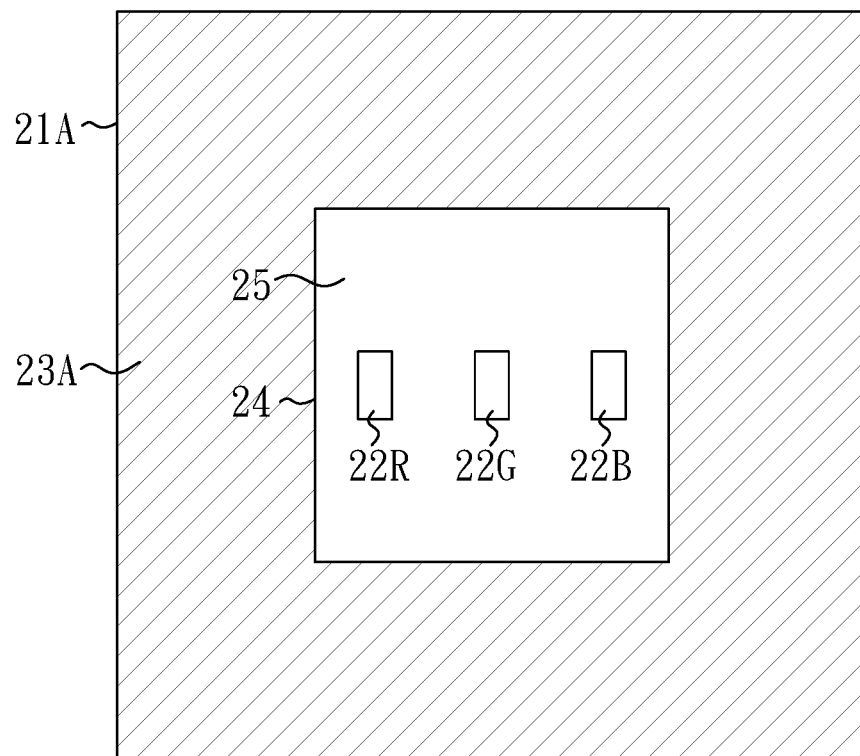
Figure 11B:
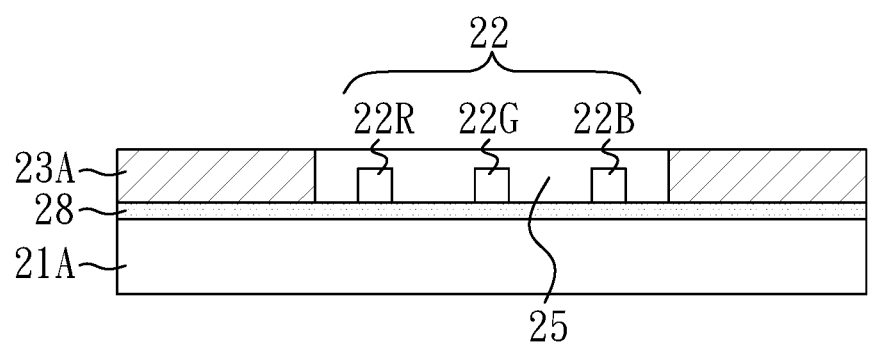

As shown in FIG. 11A and FIG. 11B, a light guiding layer 25 is disposed in the emission areas 24 to spread the light emitted by the microLEDs 22. In the embodiment, the light guiding layer 25 is entirely formed in the emission areas 24. The light guiding layer 25 has a thickness greater than the microLEDs 22 as shown in FIG. 11B. In another embodiment, however, the light guiding layer 25 has a thickness less than or equal to the microLEDs 22. It is noted that the order of forming the (first) light blocking layer 23A (FIG. 10A and FIG. 10B) and forming the light guiding layer 25 (FIG. 11A and FIG. 11B) may be exchanged.

Figure 12A:
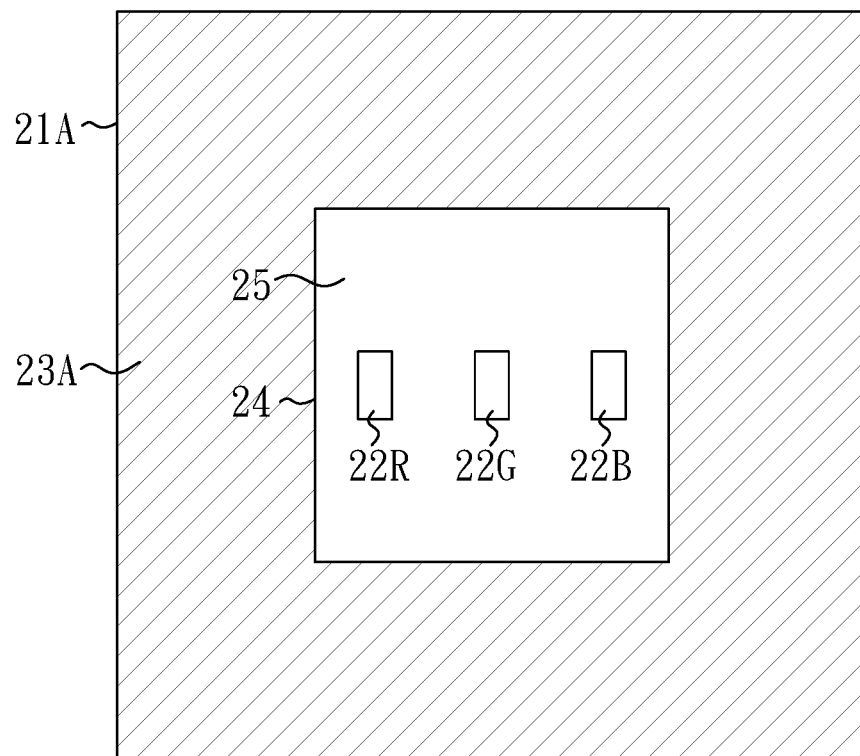
Figure 12B:
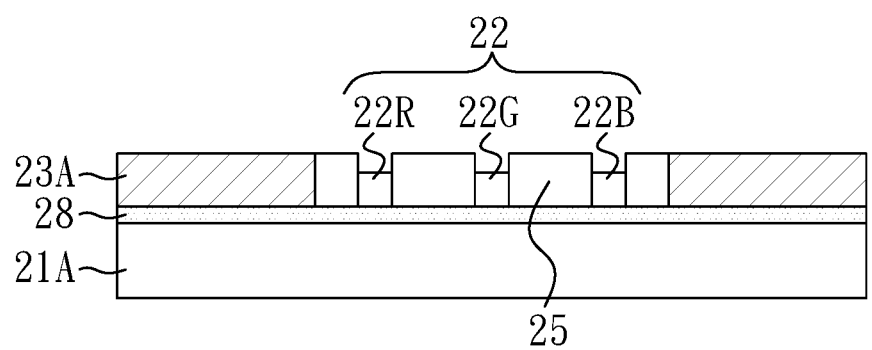
Figure 13A:
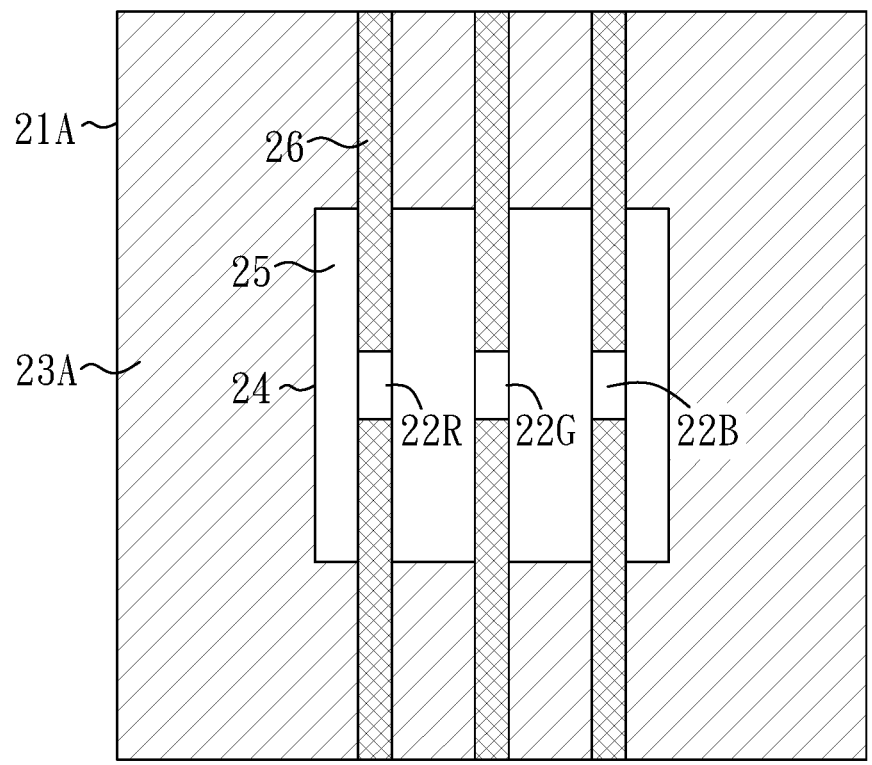
Figure 13B:
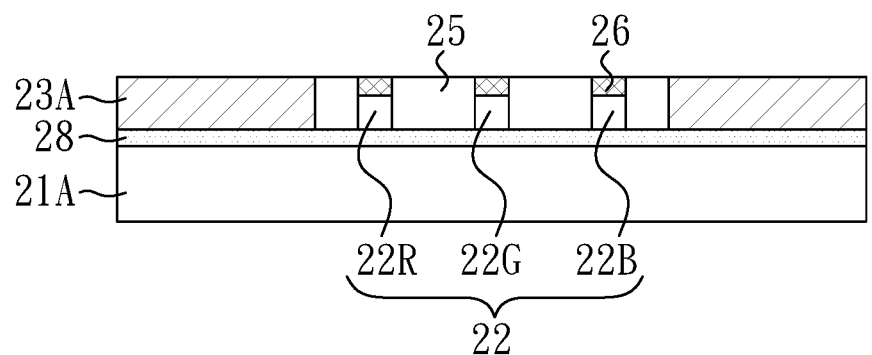

As shown in FIG. 12A and FIG. 12B, contact holes are formed above the microLEDs 22. Next, as shown in FIG. 13A and FIG. 13B, connecting structures 26 are formed to connect the microLED 22. The connecting structures 26 have the same pattern and the connecting structures 26 in each emission area 24 have the same pattern, which can prevent nonuniform display issue.

Figure 14:
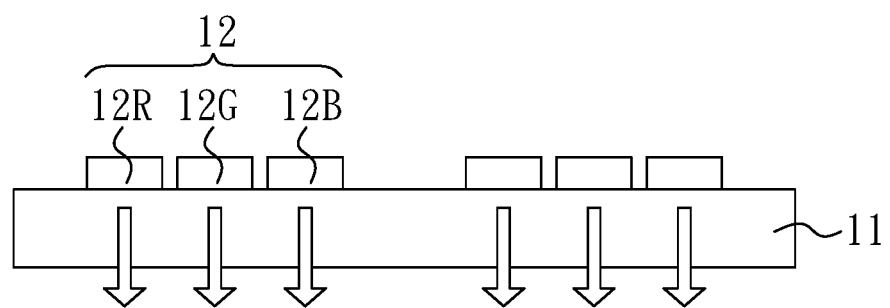
FIG. 14 schematically shows a side view of a bottom emission micro light-emitting diode (microLED) display.

FIG. 14 schematically shows a side view of a bottom emission micro light-emitting diode (microLED) display 1400. In the embodiment, microLEDs 12 (e.g., red microLED 12R, green microLED 12G and blue microLED 12B) may be disposed above a main substrate 11 by a bonding technique. As the microLEDs 12 emit light downward (as shown by arrows) against the top surface of the main substrate 11, the display 1400 is called a bottom emission microLED display. In the specification, the microLEDs 12 have a size of 1-10 micrometers, which may be decreased or increased according to specific applications or technological development in the future.

Figure 15A:
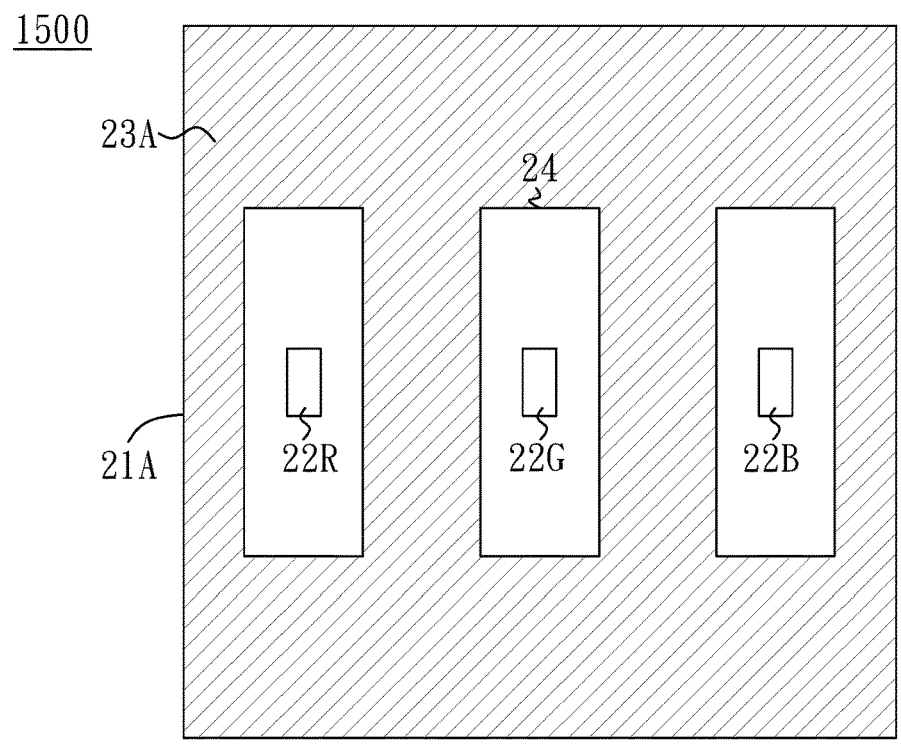
FIG. 15A shows a top view of a bottom emission microLED display according to a sixth embodiment of the present invention.
Figure 15B:
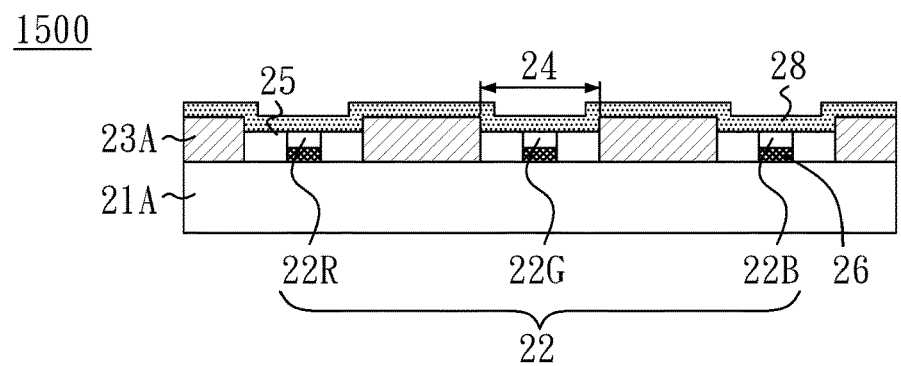
FIG. 15B shows a cross-sectional view of FIG. 15A.

FIG. 15A shows a top view of a bottom emission microLED display 1500 according to a sixth embodiment of the present invention, and FIG. 15B shows a cross-sectional view of FIG. 15A. In the embodiment, microLEDs 22 (e.g., red microLED 22R, green microLED 22G and blue microLED 22B) may be disposed on a top surface of a (first) main substrate 21A. A (first) light blocking layer 23A is disposed between adjacent microLEDs 22 and above the (first) main substrate 21A to prevent interference (e.g., color mixing) between adjacent microLEDs 22 and to enhance contrast. A top common electrode layer 28 may be disposed above the microLEDs 22 and the light blocking layer 23A.

The (first) light blocking layer 23A of the embodiment may include black matrix (BM). In the embodiment shown in FIG. 15B, black resin is first formed, followed by adopting photo process and curing process to form the BM (first) light blocking layer 23A. In another embodiment, ink-jet printing technique and curing process are adopted to form the BM (first) light blocking layer 23A.

The (first) light blocking layer 23A defines emission areas 24, which are not covered with the (first) light blocking layer 23A. In other words, areas other than the emission areas 24 are covered with the (first) light blocking layer 23A. A light guiding layer 25, composed of light guiding material, is disposed in the emission areas 24 to spread the light emitted by the microLEDs 22. The light guiding material is transparent with high refractive index. In the embodiment, the light guiding layer 25 is entirely formed in the emission areas 24.

In the embodiment, the (first) light blocking layer 23A has a thickness greater than the light guiding layer 25. Further, the light guiding layer 25 has a thickness greater than the microLEDs 22 as shown in FIG. 15B. In another embodiment, however, the light guiding layer 25 has a thickness less than or equal to the microLEDs 22.

Figure 15C:
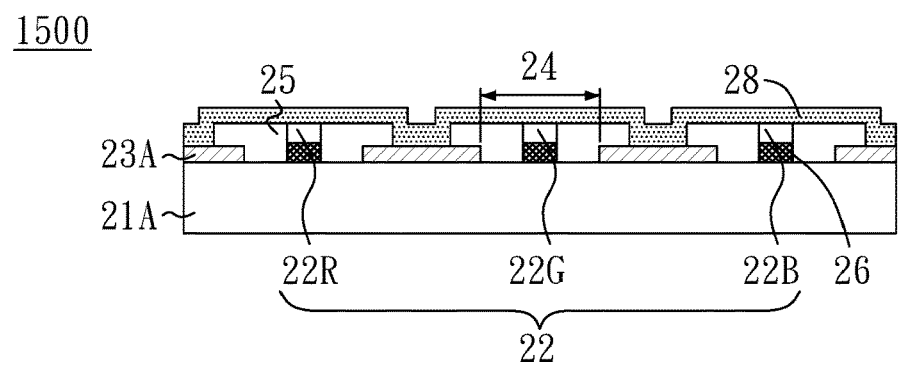
FIG. 15C shows a cross-sectional view of a bottom emission microLED display according to a modified sixth embodiment of the present invention.

FIG. 15C shows a cross-sectional view of a bottom emission microLED display 1500 according to a modified sixth embodiment of the present invention. In the embodiment shown in FIG. 15C, the (first) light blocking layer 23A has a thickness less than the light guiding layer 25. Moreover, the (first) light blocking layer 23A and the light guiding layer 25 partially overlap each other, and the (first) light blocking layer 23A is partially covered with the light guiding layer 25. In the embodiment shown in FIG. 15C, a chromium/chromium oxide film is first formed, followed by adopting photo etching technique to form the BM (first) light blocking layer 23A.

Figure 15D:
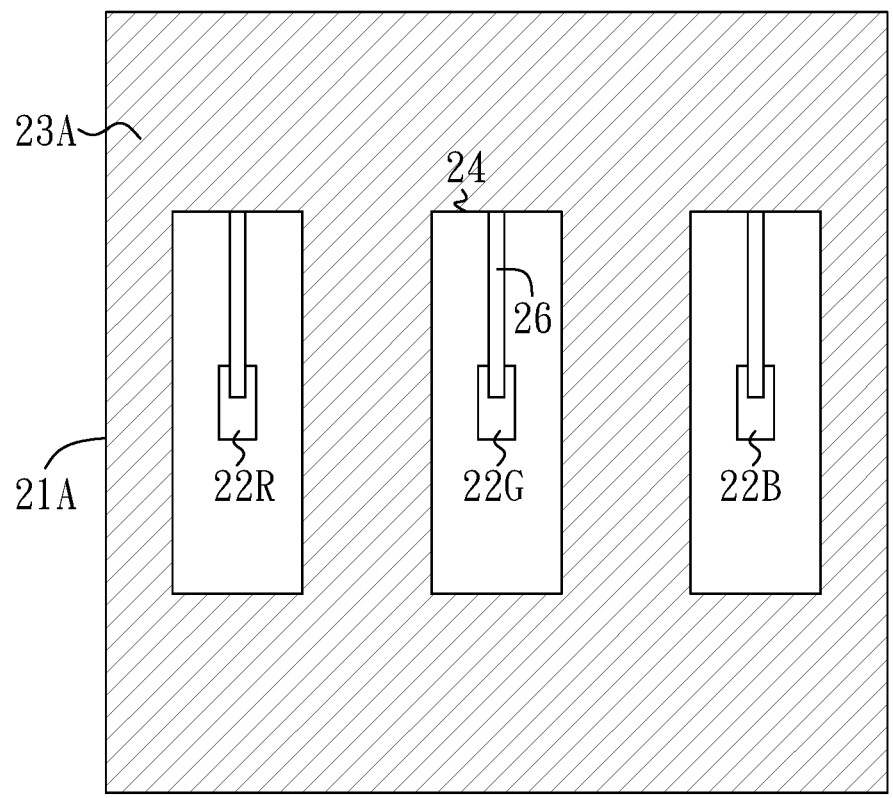
FIG. 15D shows another top view of the bottom emission microLED display according to the sixth embodiment of the present invention.

FIG. 15D shows another top view of the bottom emission microLED display 1500 according to the sixth embodiment of the present invention. A connecting structure 26, such as conductive electrode, is disposed between the microLEDs 22 and the main substrate 21A in each emission area 24. The connecting structure may include transparent material (e.g., indium tin oxide), opaque material (e.g., metal) or reflective material. According to one aspect of the embodiment, the connecting structures 26 in the emission areas 24 have the same pattern, which can prevent nonuniform display issue.

Figure 16A:
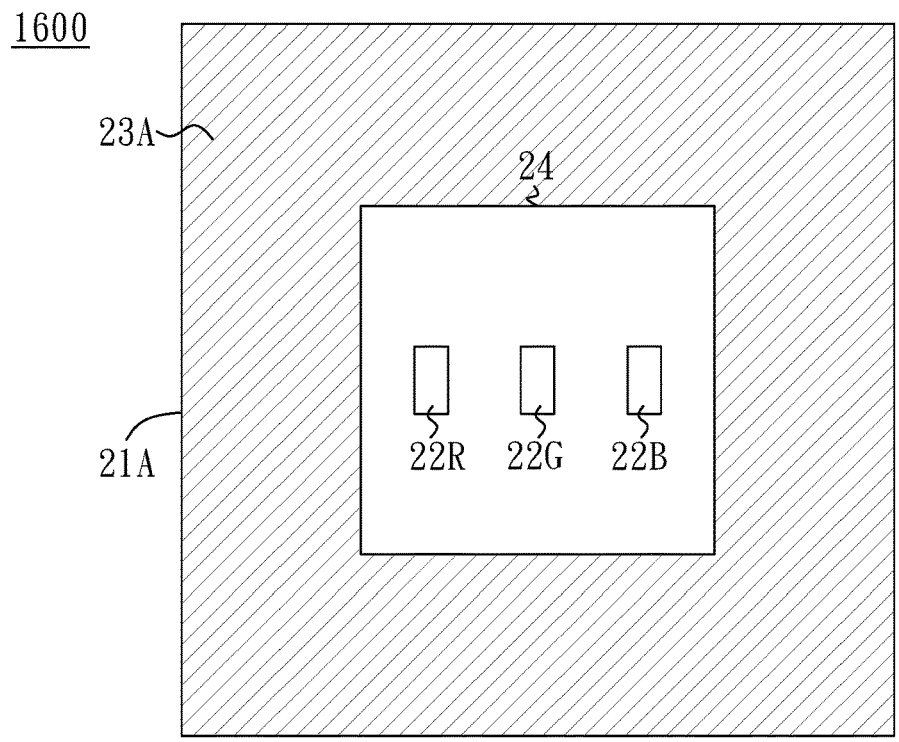
FIG. 16A shows a top view of a bottom emission microLED display according to a seventh embodiment of the present invention.
Figure 16B:
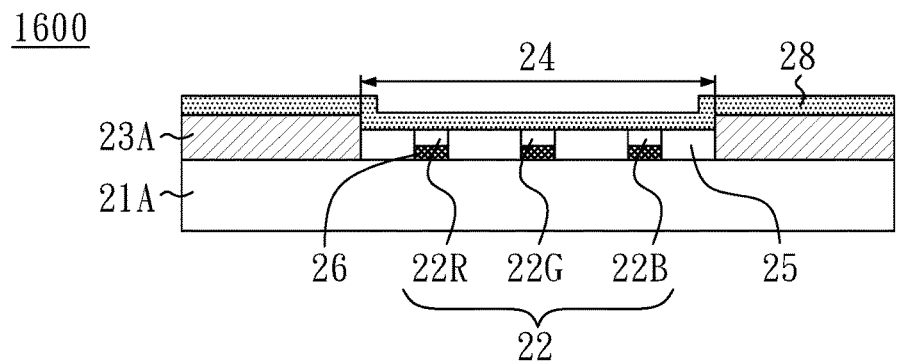
FIG. 16B shows a cross-sectional view of FIG. 16A.

FIG. 16A shows a top view of a bottom emission microLED display 1600 according to a seventh embodiment of the present invention, and FIG. 16B shows a cross-sectional view of FIG. 16A. The seventh embodiment is similar to the sixth embodiment with the exception that, in the seventh embodiment, the (first) light blocking layer 23A is disposed between adjacent pixels (instead of adjacent microLEDs 22) to prevent interference (e.g., color mixing) between adjacent pixels and to enhance contrast.

The (first) light blocking layer 23A defines emission areas 24, which are not covered with the (first) light blocking layer 23A. In other words, areas other than the emission areas 24 are covered with the (first) light blocking layer 23A. In the embodiment, the light guiding layer 25 is entirely formed in the emission areas 24.

In the embodiment, the (first) light blocking layer 23A has a thickness greater than the light guiding layer 25. Further, the light guiding layer 25 has a thickness greater than the microLEDs 22 as shown in FIG. 16B. In another embodiment, however, the light guiding layer 25 has a thickness less than or equal to the microLEDs 22.

Figure 16C:
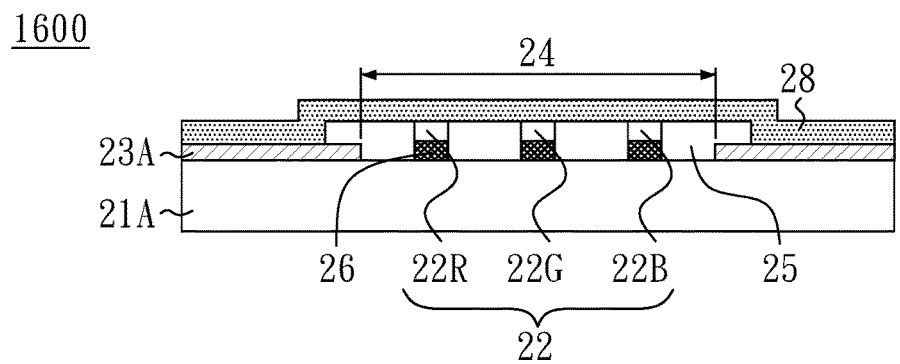
FIG. 16C shows a cross-sectional view of a bottom emission microLED display according to a modified seventh embodiment of the present invention.

FIG. 16C shows a cross-sectional view of a bottom emission microLED display 1600 according to a modified seventh embodiment of the present invention. In the embodiment shown in FIG. 16C, the (first) light blocking layer 23A has a thickness less than the light guiding layer 25. Moreover, the (first) light blocking layer 23A and the light guiding layer 25 partially overlap each other, and the (first) light blocking layer 23A is partially covered with the light guiding layer 25.

Figure 16D:
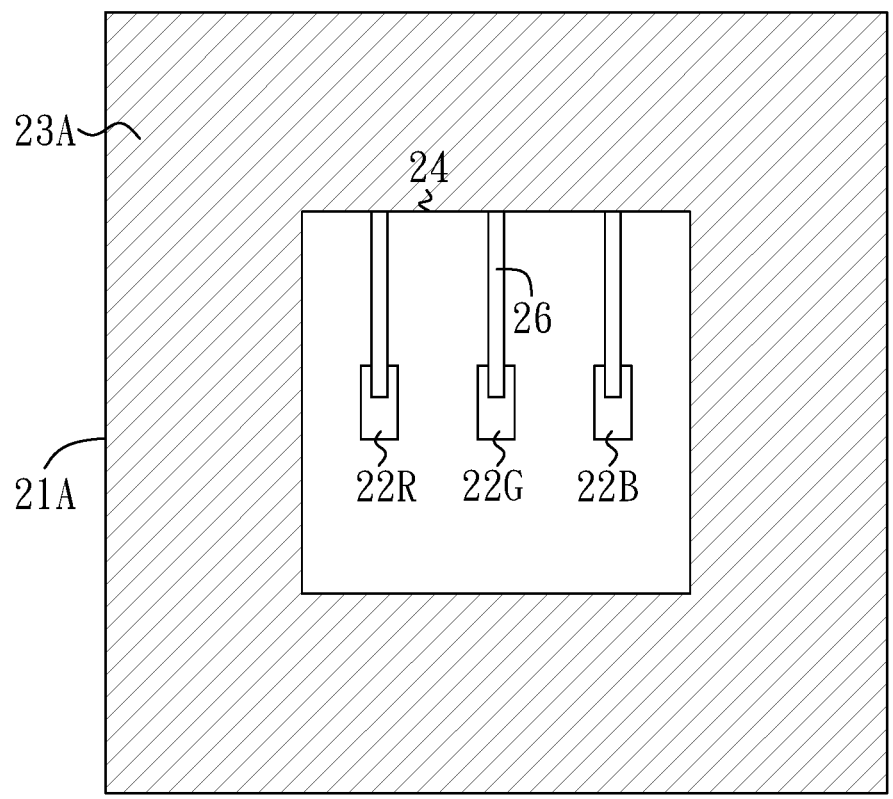
FIG. 16D shows another top view of the bottom emission microLED display according to the seventh embodiment of the present invention.

FIG. 16D shows another top view of the bottom emission microLED display 1600 according to the seventh embodiment of the present invention. A connecting structure 26, such as conductive electrode, is disposed on a top surface of the microLED 22 in each emission area 24. According to one aspect of the embodiment, the connecting structures 26 in the emission areas 24 have the same pattern and the connecting structures 26 in each emission area 24 have the same pattern, which can prevent nonuniform display issue.

Figure 17A:
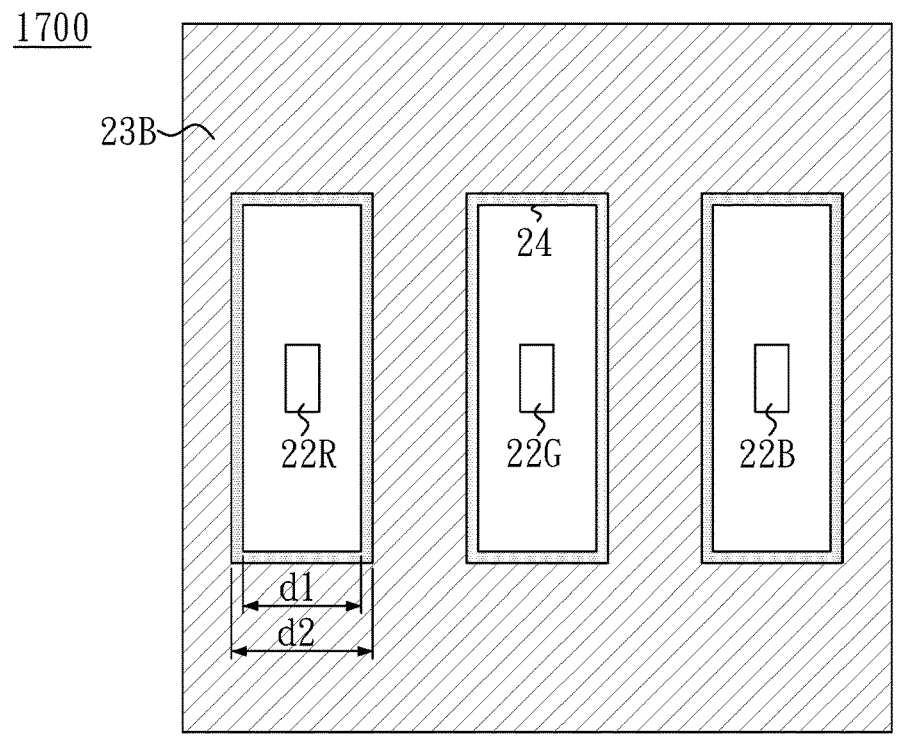
FIG. 17A shows a top view of a bottom emission microLED display according to an eighth embodiment of the present invention.
Figure 17B:
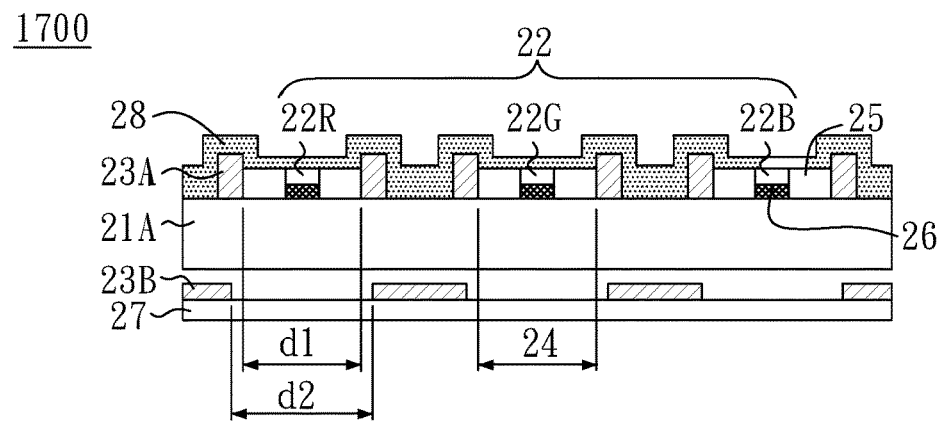
FIG. 17B shows a cross-sectional view of FIG. 17A.

FIG. 17A shows a top view of a bottom emission microLED display 1700 according to an eighth embodiment of the present invention, and FIG. 17B shows a cross-sectional view of FIG. 17A. In the embodiment, microLEDs 22 (e.g., red microLED 22R, green microLED 22G and blue microLED 22B) may be disposed above a (first) main substrate 21A. Each microLED 22 corresponds to an emission area 24. In the embodiment, a frame-shaped first light blocking layer 23A surrounds the emission area 24 and is disposed above the (first) main substrate 21A. In the embodiment, a blocking substrate 27 is disposed below the (first) main substrate 21A. A second light blocking layer 23B, which covers areas other than the emission areas 24 and the first light blocking layer 23A, is disposed on a top surface of the blocking substrate 27. The first light blocking layer 23A and the second light blocking layer 23B partially overlap each other. Accordingly, an aperture d1 of the first light blocking layer 23A is different from (e.g., smaller than) an aperture d2 of the second light blocking layer 23B. In another embodiment, the aperture of the first light blocking layer 23A is greater than the aperture of the second light blocking layer 23B. In the embodiment, the first light blocking layer 23A and the second light blocking layer 23B may include BM, and the blocking substrate 27 may include transparent material such as quartz, glass or plastic material.

A light guiding layer 25, composed of light guiding material, is disposed in the emission areas 24 to spread the light emitted by the microLEDs 22. In the embodiment, the light guiding layer 25 is entirely formed in the emission areas 24.

In the embodiment, the first light blocking layer 23A has a thickness greater than the light guiding layer 25. Further, the light guiding layer 25 has a thickness greater than the microLEDs 22 as shown in FIG. 17B. In another embodiment, however, the light guiding layer 25 has a thickness less than or equal to the microLEDs 22.

Figure 17C:
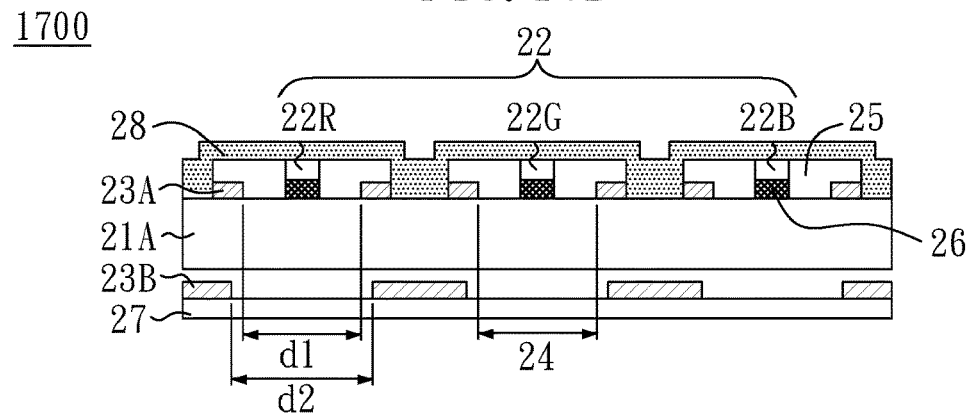
FIG. 17C shows a cross-sectional view of a bottom emission microLED display according to a modified eighth embodiment of the present invention.

FIG. 17C shows a cross-sectional view of a bottom emission microLED display 1700 according to a modified eighth embodiment of the present invention. In the embodiment shown in FIG. 17C, the first light blocking layer 23A has a thickness less than the light guiding layer 25. Moreover, the first light blocking layer 23A is partially covered with the light guiding layer 25.

According to one aspect of the embodiment, the connecting structures 26 (not shown) in each emission area 24 have the same pattern, which can prevent nonuniform display issue.

Figure 18A:
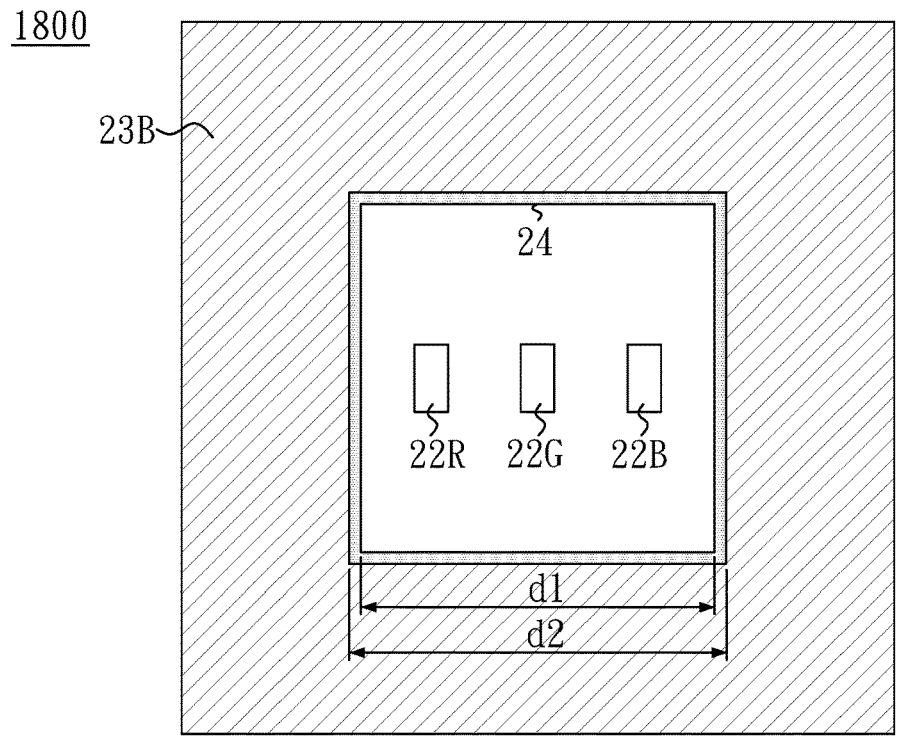
FIG. 18A shows a top view of a bottom emission microLED display according to a ninth embodiment of the present invention.
Figure 18B:
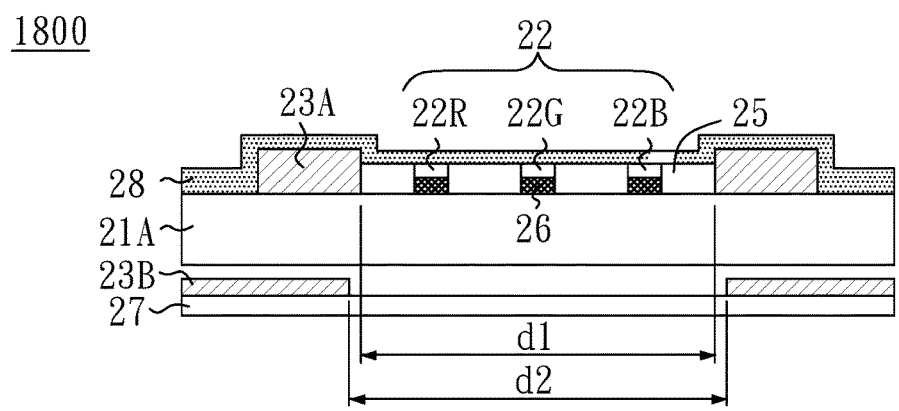
FIG. 18B shows a cross-sectional view of FIG. 18A.

FIG. 18A shows a top view of a bottom emission microLED display 1800 according to a ninth embodiment of the present invention, and FIG. 18B shows a cross-sectional view of FIG. 18A. The ninth embodiment is similar to the eighth embodiment with the exception that, in the ninth embodiment, the first light blocking layer 23A and the second light blocking layer 23B are disposed between adjacent pixels (instead of adjacent microLEDs 22) to prevent interference (e.g., color mixing) between adjacent pixels and to enhance contrast.

In the embodiment, each pixel (which includes red microLED 22R, green microLED 22G and blue microLED 22B) corresponds to an emission area 24. In the embodiment, a frame-shaped first light blocking layer 23A surrounds the emission area 24 and is disposed above the (first) main substrate 21A. In the embodiment, a second light blocking layer 23B, which covers areas other than the emission areas 24 and the first light blocking layer 23A, is disposed on a top surface of the blocking substrate 27. The first light blocking layer 23A and the second light blocking layer 23B partially overlap each other. Accordingly, an aperture d1 of the first light blocking layer 23A is different from (e.g., smaller than) an aperture d2 of the second light blocking layer 23B. In the embodiment, the first light blocking layer 23A and the second light blocking layer 23B may include BM, and the blocking substrate 27 may include transparent material such as quartz, glass or plastic material.

A light guiding layer 25, composed of light guiding material, is disposed in the emission areas 24 to spread the light emitted by the microLEDs 22. In the embodiment, the light guiding layer 25 is entirely formed in the emission areas 24.

In the embodiment, the first light blocking layer 23A has a thickness greater than the light guiding layer 25. Further, the light guiding layer 25 has a thickness greater than the microLEDs 22 as shown in FIG. 18B. In another embodiment, however, the light guiding layer 25 has a thickness less than or equal to the microLEDs 22.

Figure 18C:
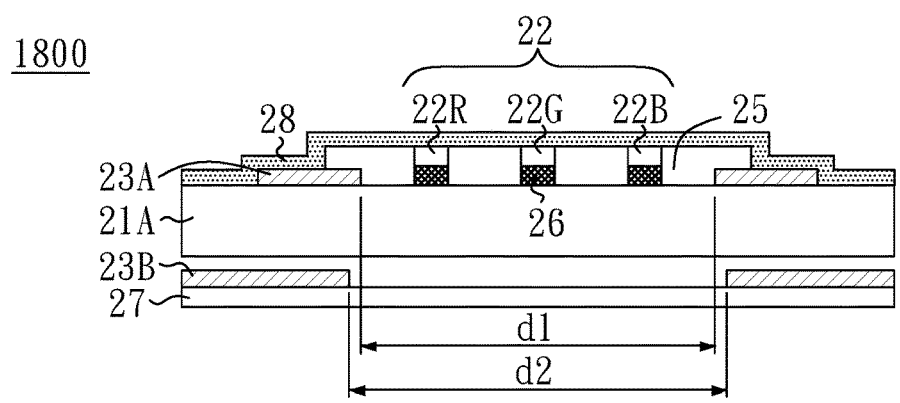
FIG. 18C shows a cross-sectional view of a bottom emission microLED display according to a modified ninth embodiment of the present invention.

FIG. 18C shows a cross-sectional view of a bottom emission microLED display 1800 according to a modified ninth embodiment of the present invention. In the embodiment shown in FIG. 18C, the first light blocking layer 23A has a thickness less than the light guiding layer 25. Moreover, the first light blocking layer 23A is partially covered with the light guiding layer 25.

According to one aspect of the embodiment, the connecting structures 26 (not shown) in the emission areas 24 have the same pattern and the connecting structures 26 in each emission area 24 have the same pattern, which can prevent nonuniform display issue.

Figure 19:
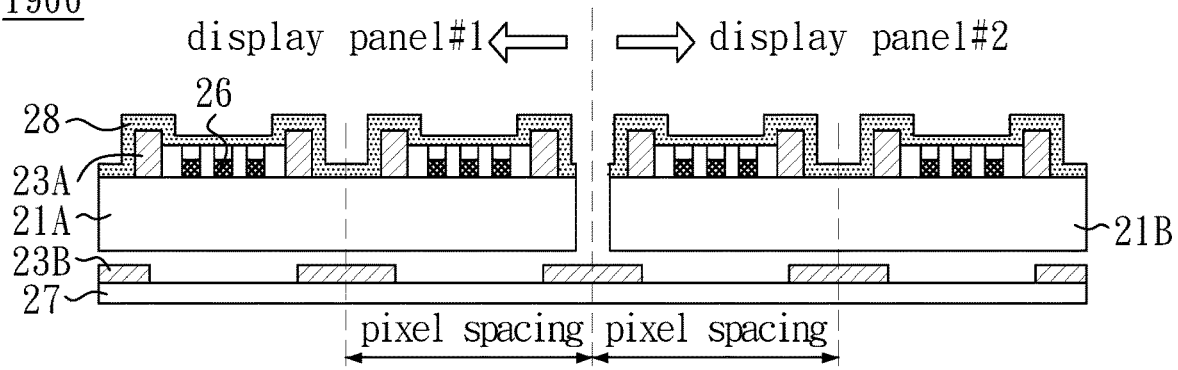
FIG. 19 shows a cross-sectional view of a bottom emission microLED display according to a tenth embodiment of the present invention.

FIG. 19 shows a cross-sectional view of a bottom emission microLED display 1900 according to a tenth embodiment of the present invention. In the embodiment, the bottom emission microLED display 1900 may include a first main substrate 21A and a second main substrate 21B, which are disposed at a same level but correspond to distinct microLED displays, respectively. A first light blocking layer 23A is disposed above the first main substrate 21A and the second main substrate 21B. Similar to the ninth embodiment, the bottom emission microLED display 1900 may include a second light blocking layer 23B, which covers areas other than the emission areas 24 and the first light blocking layer 23A, being disposed on a top surface of the blocking substrate 27. As shown in FIG. 19, the first main substrate 21A and the second main substrate 21B correspond to the same blocking substrate 27, and the first light blocking layer 23A of the first main substrate 21A and the second light blocking layer 23B of the second main substrate 21B correspond to the same second light blocking layer 23B at a joint of the first main substrate 21A and the second main substrate 21B. Accordingly, multiple microLED displays may be joined to become a seamless bottom emission microLED display 1900.

Figure 20A:
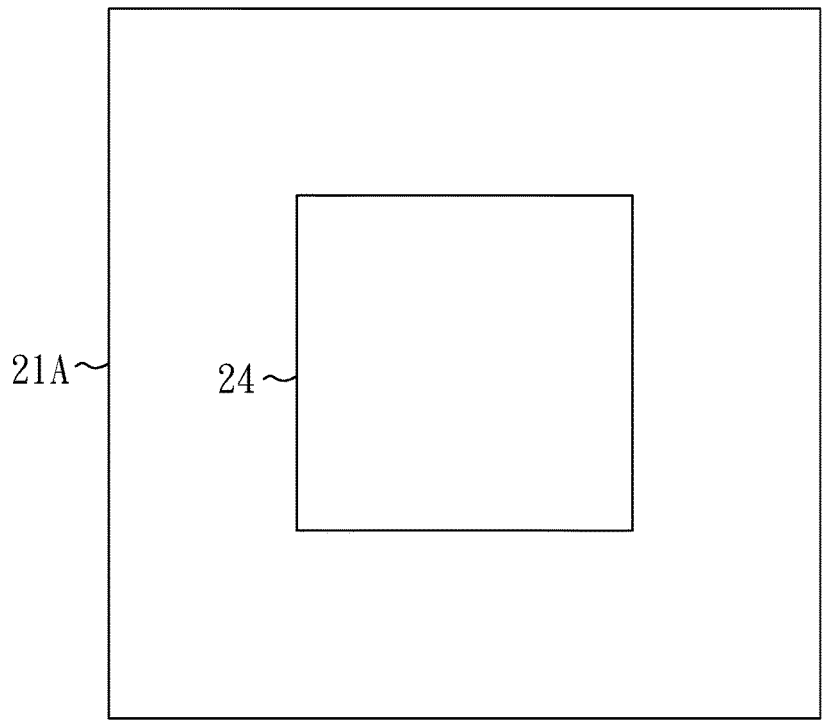
FIG. 20A to FIG. 26B show top views and cross-sectional views illustrating steps of forming a bottom emission microLED display according to one embodiment of the present invention.
Figure 20B:
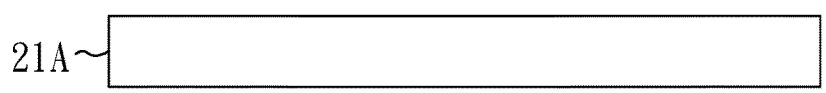
Figure 21A:
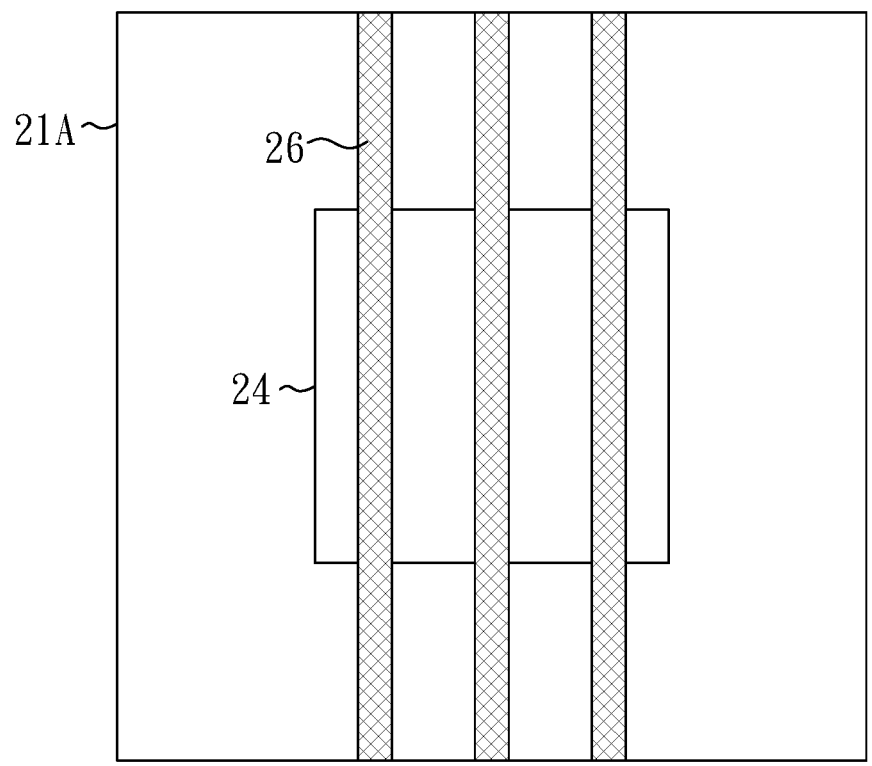
Figure 21B:
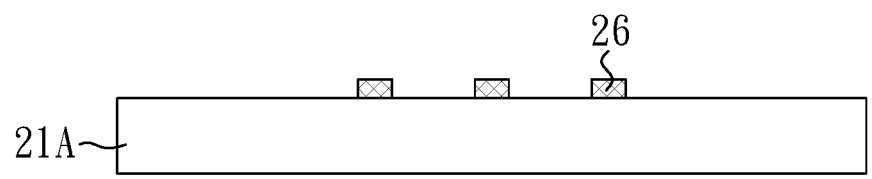

FIG. 20A to FIG. 26B show top views and cross-sectional views illustrating steps of forming a bottom emission microLED display according to one embodiment of the present invention. As shown in FIG. 20A and FIG. 20B, a (first) main substrate 21A, which defines an emission area 24, is provided. As shown in FIG. 21A and FIG. 21B, connecting structures 26 are formed to connect the microLED 22. The connecting structures 26 have the same pattern and the connecting structures 26 in each emission area 24 have the same pattern, which can prevent nonuniform display issue.

Figure 22A:
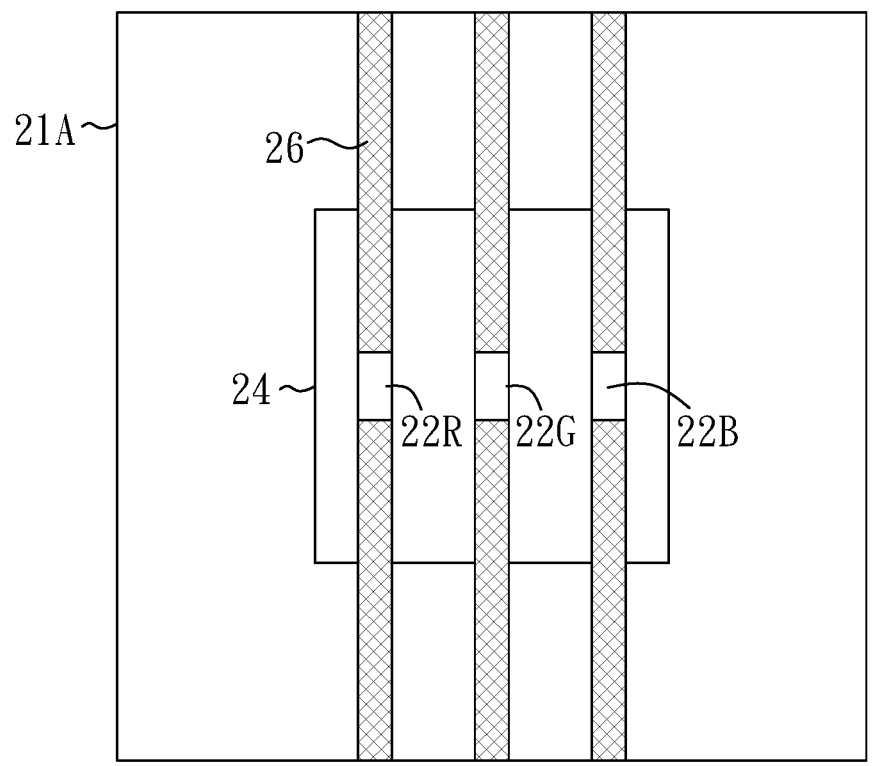
Figure 22B:
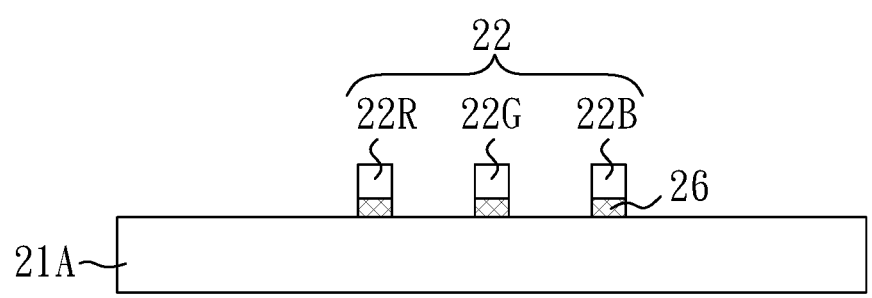
Figure 23A:
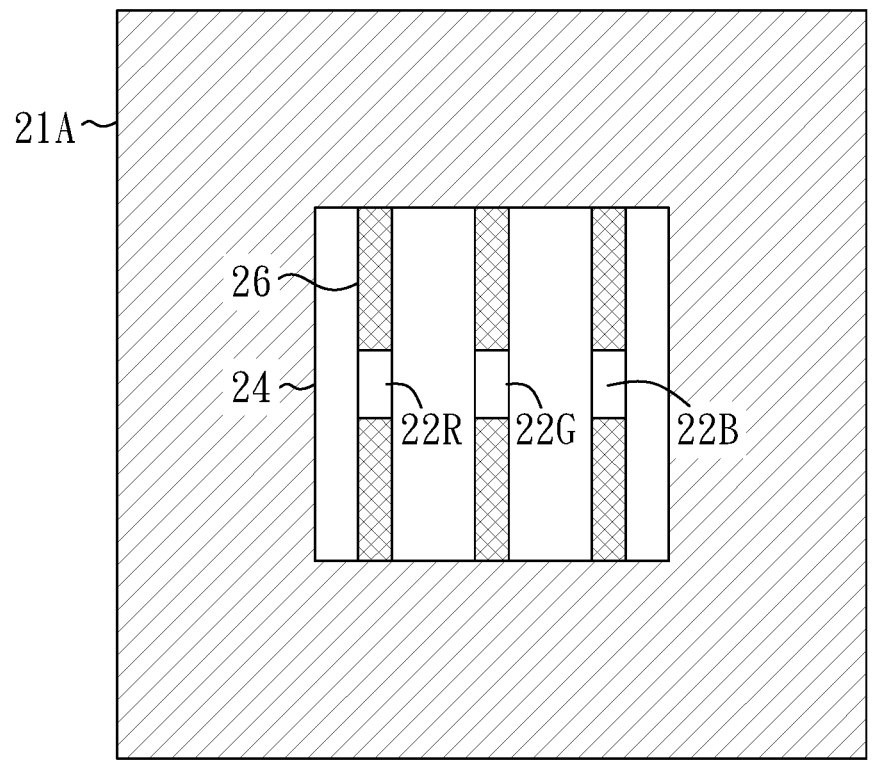
Figure 23B:
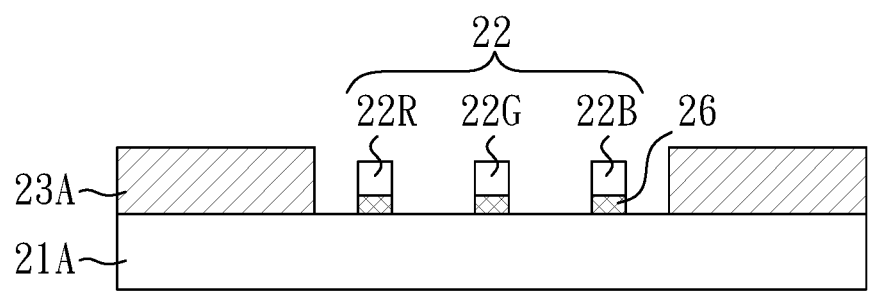

As shown in FIG. 22A and FIG. 22B, microLEDs 12 (e.g., red microLED 12R, green microLED 12G and blue microLED 12B) are disposed on a top surface of the bottom common electrode layer 28 by a bonding technique. As shown in FIG. 23A and FIG. 23B, a (first) light blocking layer 23A is disposed in an area other than the emission area 24 to prevent interference (e.g., color mixing) between adjacent pixels and to enhance contrast.

Figure 24A:
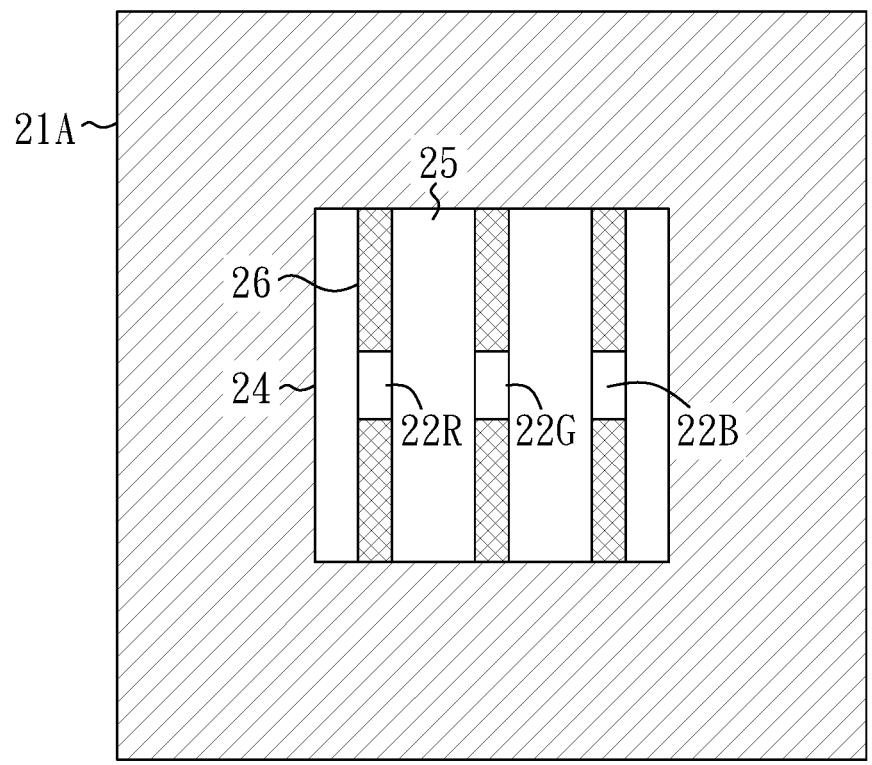
Figure 24B:
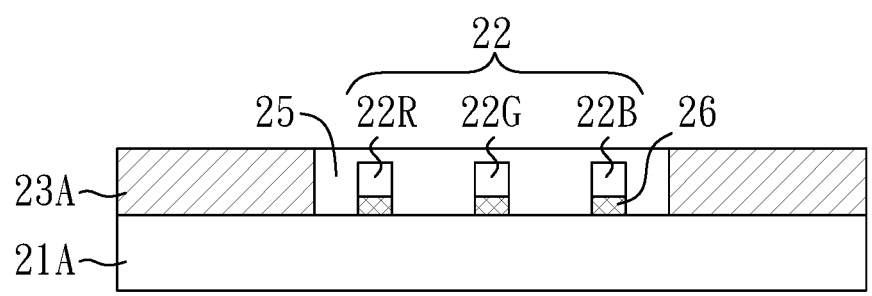

As shown in FIG. 24A and FIG. 24B, a light guiding layer 25 is disposed in the emission areas 24 to spread the light emitted by the microLEDs 22. In the embodiment, the light guiding layer 25 is entirely formed in the emission areas 24. The light guiding layer 25 has a thickness greater than the microLEDs 22 as shown in FIG. 24B. In another embodiment, however, the light guiding layer 25 has a thickness less than or equal to the microLEDs 22. It is noted that the order of forming the (first) light blocking layer 23A (FIG. 23A and FIG. 23B) and forming the light guiding layer 25 (FIG. 24A and FIG. 24B) may be exchanged.

Figure 25A:
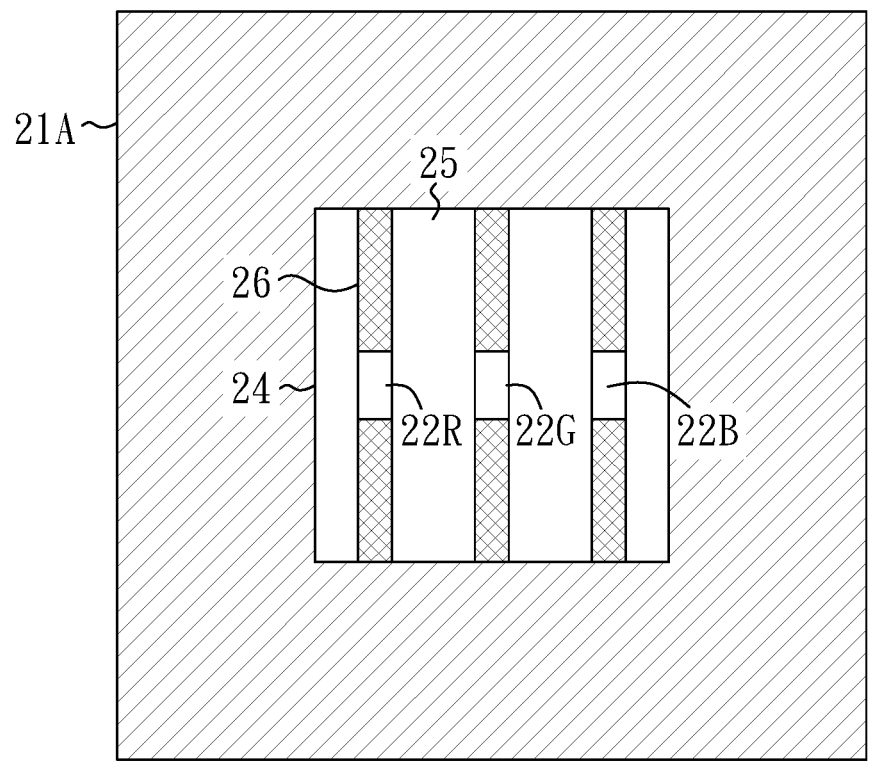
Figure 25B:
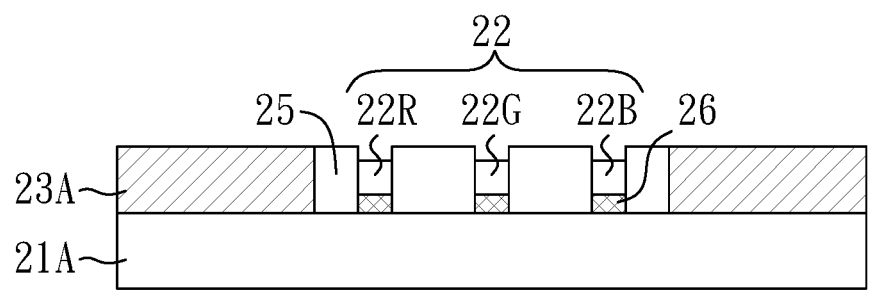
Figure 26A:
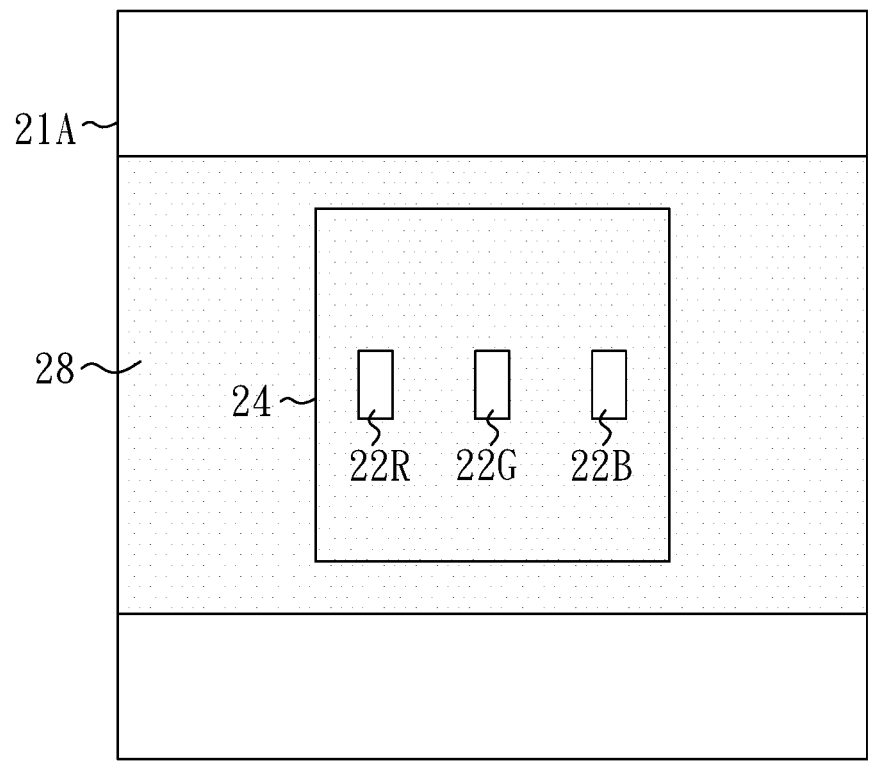
Figure 26B:
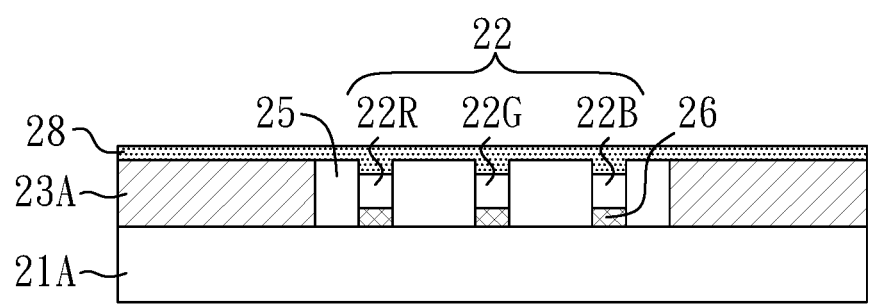

As shown in FIG. 25A and FIG. 25B, contact holes are formed above the microLEDs 22. Next, as shown in FIG. 26A and FIG. 26B, a top common electrode layer 28 is formed above the light guiding layer 25. According to one aspect of the embodiment, the top common electrode layer 28 entirely covers the emission area 24 to prevent nonuniform display issue.

Figure 27:
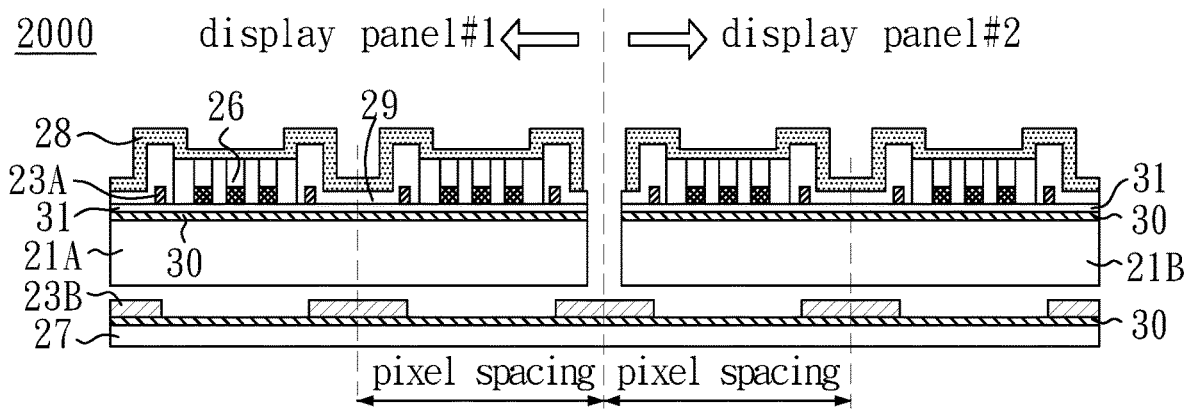
FIG. 27 shows a cross-sectional view of a bottom emission microLED display according to an eleventh embodiment of the present invention.

FIG. 27 shows a cross-sectional view of a bottom emission microLED display 2000 according to an eleventh embodiment of the present invention. Compared to FIG. 19, the bottom emission microLED display 2000 of the present embodiment may include at least one shielding layer 30 for blocking electromagnetic interference (EMI). In one embodiment, the shielding layer 30 may include transparent conductive material such as transparent conductive oxide (e.g., indium tin oxide (ITO), indium zinc oxide (IZO) or aluminum doped Zinc Oxide (AZO)).

The shielding layer 30 may be disposed between a top surface of the first main substrate 21A and first light blocking layer 23A. The shielding layer 30 may be electrically insulated from the top common electrode layer 28 by an insulating layer 29, and may be electrically insulated from the connecting structure 26 by an insulating layer 31. Similarly, the shielding layer 30 may be disposed between a top surface of the second main substrate 21B and first light blocking layer 23A. The shielding layer 30 may be electrically insulated from the top common electrode layer 28 by an insulating layer 29, and may be electrically insulated from the connecting structure 26 by an insulating layer 31. The shielding layer 30 may be disposed between a top surface of the blocking substrate 27 and the second light blocking layer 23B. Generally speaking, the shielding layer 30 may be disposed in one or more areas mentioned above.

Figure 28:
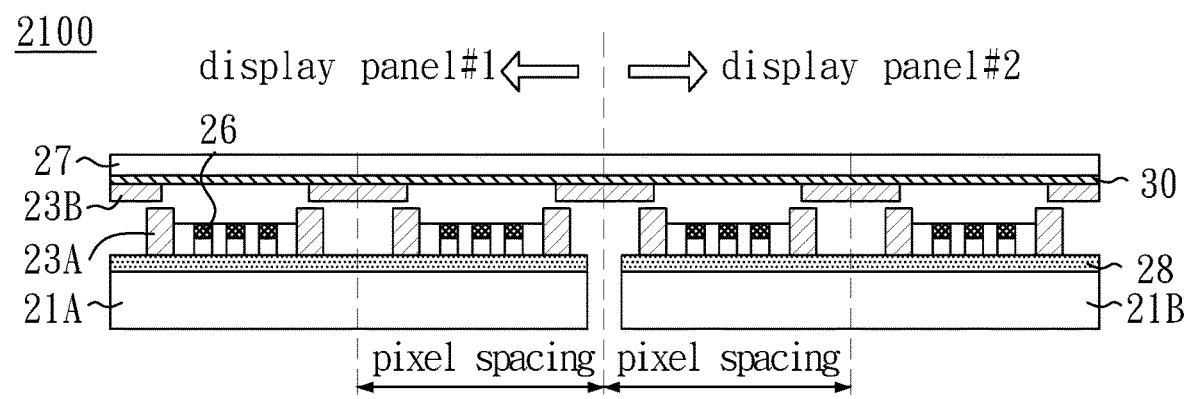
FIG. 28 shows a cross-sectional view of a top emission microLED display according to a twelfth embodiment of the present invention.

The shielding layer 30 may be adaptable to a top emission microLED display. FIG. 28 shows a cross-sectional view of a top emission microLED display 2100 according to a twelfth embodiment of the present invention. Compared to FIG. 6, the top emission microLED display 2100 of the present embodiment may include at least one shielding layer 30 for blocking electromagnetic interference (EMI). In one embodiment, the shielding layer 30 may include transparent conductive material such as transparent conductive oxide (e.g., indium tin oxide (ITO), indium zinc oxide (IZO) or aluminum doped Zinc Oxide (AZO)). In the embodiment, the shielding layer 30 may be disposed between a bottom surface of the blocking substrate 27 and the second light blocking layer 23B.

Figure 29:
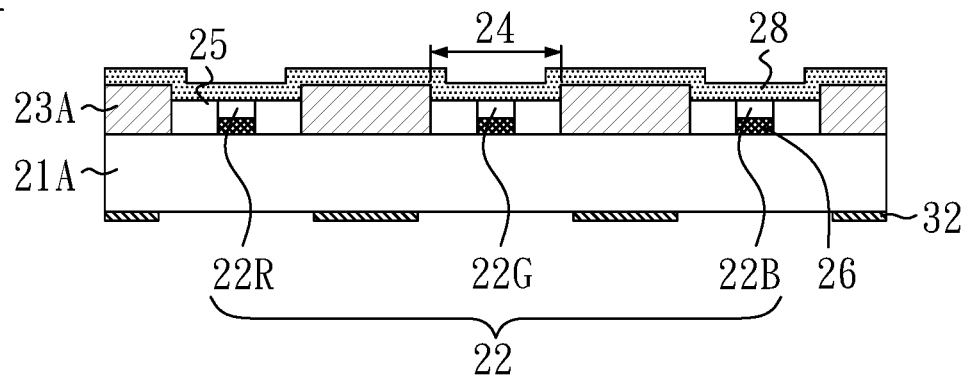
FIG. 29 shows a cross-sectional view of a bottom emission microLED display according to a thirteenth embodiment of the present invention.
Figure 30:
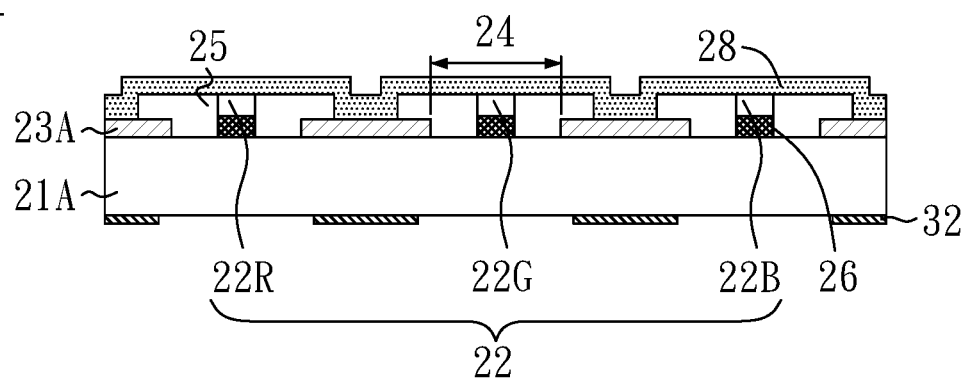
FIG. 30 shows a cross-sectional view of a bottom emission microLED display according to a modified thirteenth embodiment of the present invention.

FIG. 29 shows a cross-sectional view of a bottom emission microLED display 2900 according to a thirteenth embodiment of the present invention. Compared to FIG. 15B, the bottom emission microLED display 2900 of the present embodiment may include an anti-floodlight layer 32 disposed on a bottom surface of the first main substrate 21A and between adjacent microLEDs 22. In other words, the anti-floodlight layer 32 may be disposed on the first main substrate 21A opposite the (first) light blocking layer 23A. FIG. 30 shows a cross-sectional view of a bottom emission microLED display 2900 according to a modified thirteenth embodiment of the present invention. Compared to FIG. 15C, the bottom emission microLED display 2900 of the present embodiment may include an anti-floodlight layer 32 disposed on a bottom surface of the first main substrate 21A and between adjacent microLEDs 22. In other words, the anti-floodlight layer 32 may be disposed on the first main substrate 21A opposite the (first) light blocking layer 23A.

After the light emitted by the microLEDs 22 enters the first main substrate 21A, some of the generated light passes through the first main substrate 21A, while other of the generated light laterally diffuses in the first main substrate 21A due to total reflection, which may interfere with adjacent microLED 22 or pixel to result in floodlight issue. The anti-floodlight layer 32 of the embodiment may absorb lateral diffused light and effectively avoid floodlight issue.

The anti-floodlight layer 32 of the embodiment may include BM. In one example, a chromium/chromium oxide film is first formed, followed by adopting photo etching technique to form the BM anti-floodlight layer 32. In another example, black resin is first formed, followed by adopting photo process and curing process to form the BM anti-floodlight layer 32. In a further example, ink-jet printing technique and curing process are adopted to form the BM anti-floodlight layer 32. The anti-floodlight layer 32 may be directly formed on the first main substrate 21A, or may be first formed on another substrate, which is then attached on the first main substrate 21A.

Figure 31:
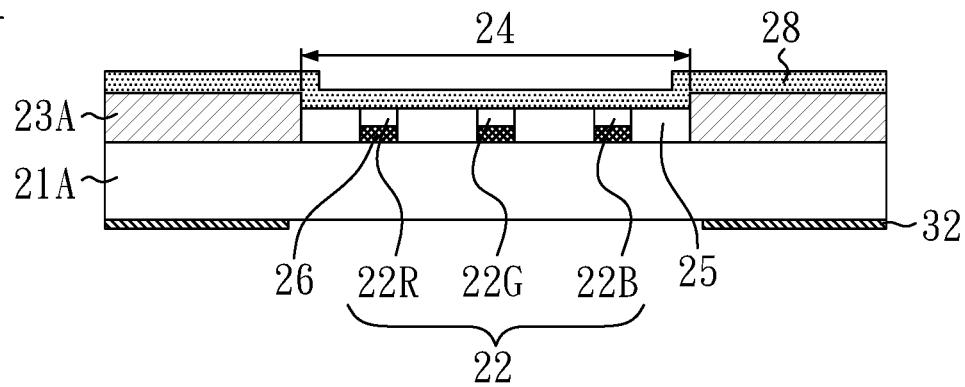
FIG. 31 shows a cross-sectional view of a bottom emission microLED display according to a fourteenth embodiment of the present invention.
Figure 32:
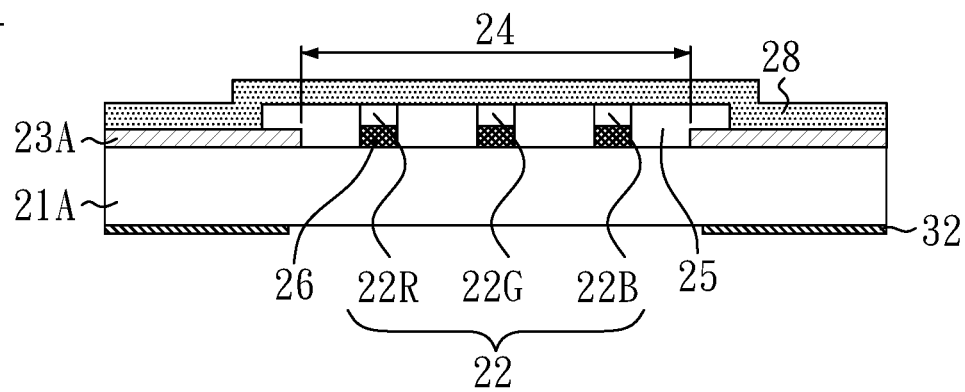
FIG. 32 shows a cross-sectional view of a bottom emission microLED display according to a modified fourteenth embodiment of the present invention.

As discussed above, the anti-floodlight layer 32 may be disposed between adjacent microLEDs 22. However, the anti-floodlight layer 32 may be disposed between adjacent pixels. FIG. 31 shows a cross-sectional view of a bottom emission microLED display 3100 according to a fourteenth embodiment of the present invention. Compared to the seventh embodiment shown in FIG. 16B, the bottom emission microLED display 3100 of the present embodiment may include an anti-floodlight layer 32 disposed on a bottom surface of the first main substrate 21A and between adjacent pixels. In other words, the anti-floodlight layer 32 may be disposed on the first main substrate 21A opposite the (first) light blocking layer 23A. FIG. 32 shows a cross-sectional view of a bottom emission microLED display 3100 according to a modified fourteenth embodiment of the present invention.

Compared to the modified seventh embodiment shown in FIG. 16C, the bottom emission microLED display 3100 of the present embodiment may include an anti-floodlight layer 32 disposed on a bottom surface of the first main substrate 21A and between adjacent pixels. In other words, the anti-floodlight layer 32 may be disposed on the first main substrate 21A opposite the (first) light blocking layer 23A.

Although specific embodiments have been illustrated and described, it will be appreciated by those skilled in the art that various modifications may be made without departing from the scope of the present invention, which is intended to be limited solely by the appended claims.

What is claimed is:

1. A bottom emission microLED display, comprising:
a first main substrate;
a plurality of microLEDs disposed above the first main substrate;
a first light blocking layer disposed above the first main substrate to define a plurality of emission areas;
a light guiding layer disposed in the plurality of emission areas;
a plurality of connecting structures disposed in the plurality of emission areas respectively and electrically connected with the microLEDs;
a top common electrode layer disposed above the first light blocking layer and the microLEDs;
a blocking substrate disposed below the first main substrate;
a second light blocking layer formed on a top surface of the blocking substrate, the second light blocking layer covering areas other than the plurality of emission areas and the first light blocking layer; and
a second main substrate disposed at a same level as the first main substrate, the first main substrate and the second main substrate corresponding to distinct microLED displays respectively, and the first light blocking layer being disposed above the first main substrate and the second main substrate;
wherein the first light blocking layer surrounding each of the plurality of emission areas has a frame shape, the first light blocking layer and the second light blocking layer partially overlapping each other;
wherein the first main substrate and the second main substrate correspond to the same blocking substrate, and the first light blocking layer of the first main substrate and the second light blocking layer of the second main substrate correspond to the same second light blocking layer at a joint of the first main substrate and the second main substrate.

2. The display of claim 1, wherein the plurality of connecting structures have a same pattern.

3. The display of claim 1, wherein the plurality of connecting structures comprise transparent material.

4. The display of claim 1, wherein the plurality of connecting structures comprise opaque material.

5. The display of claim 1, wherein the first light blocking layer comprises black matrix.

6. The display of claim 1, wherein the first light blocking layer has a thickness greater than the light guiding layer.

7. The display of claim 1, wherein each of the plurality of emission areas corresponds to a red microLED, a green microLED and a blue microLED.

8. The display of claim 1, wherein a red microLED, a green microLED and a blue microLED in each of the plurality of emission areas respectively correspond to the plurality of connecting structures with a same pattern.

9. The display of claim 1, wherein the plurality of connecting structures are entirely formed in the emission areas.

10. The display of claim 1, further comprising a shielding layer disposed between the first main substrate and the first light blocking layer for blocking electromagnetic interference.

11. The display of claim 10, wherein the shielding layer comprises transparent material.

12. The display of claim 1, wherein an aperture of the first light blocking layer is different from an aperture of the second light blocking layer.

13. The display of claim 1, wherein the second light blocking layer comprises black matrix.

14. The display of claim 1, wherein the blocking substrate comprises transparent material.

15. The display of claim 1, further comprising a shielding layer disposed between the blocking substrate and the second light blocking layer for blocking electromagnetic interference.

16. The display of claim 15, wherein the shielding layer comprises transparent material.

17. The display of claim 1, further comprising a shielding layer disposed between the second main substrate and the first light blocking layer for blocking electromagnetic interference.

18. The display of claim 17, wherein the shielding layer comprises transparent material.

19. The display of claim 1, the microLED is a rectangle and is disposed longitudinally.

* * * * *